(12) United States Patent
Bruennert

(10) Patent No.: US 8,907,830 B2
(45) Date of Patent: Dec. 9, 2014

(54) DIGITAL-TO-ANALOG CONVERTER COMPRISING SLOW CONVERTER SECTION AND FAST CONVERTER SECTION

(71) Applicant: Intel Mobile Communications GmbH, Neubiberg (DE)

(72) Inventor: Michael Bruennert, Unterhaching (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/802,962

(22) Filed: Mar. 14, 2013

(65) Prior Publication Data

US 2014/0266834 A1    Sep. 18, 2014

(51) Int. Cl.
*H03M 1/66* (2006.01)

(52) U.S. Cl.
CPC ........................................ *H03M 1/66* (2013.01)
USPC ............................................ 341/145; 341/61

(58) Field of Classification Search
CPC . H03M 1/0626; H03M 1/0836; H03M 1/682; H03M 1/747; H03M 1/765; H03M 1/66
USPC ................................................ 341/144, 145
See application file for complete search history.

(56) References Cited

U.S. PATENT DOCUMENTS

| | | | | |
|---|---|---|---|---|
| 4,998,108 | A * | 3/1991 | Ginthner et al. | 341/145 |
| 6,987,473 | B1 * | 1/2006 | Nussbaum | 341/143 |
| 7,095,799 | B2 * | 8/2006 | Braithwaite | 375/296 |
| 7,283,082 | B1 * | 10/2007 | Kuyel et al. | 341/155 |
| 7,372,386 | B1 * | 5/2008 | Maloberti et al. | 341/144 |
| 7,573,411 | B2 | 8/2009 | Shin et al. | |
| 7,589,653 | B2 * | 9/2009 | Guedon et al. | 341/144 |
| 7,893,774 | B2 * | 2/2011 | Kitayama et al. | 331/17 |
| 7,994,957 | B2 * | 8/2011 | O'Donnell et al. | 341/144 |
| 8,411,791 | B2 * | 4/2013 | Kolze et al. | 375/296 |
| 2011/0085616 | A1 | 4/2011 | Kuttner | |

* cited by examiner

*Primary Examiner* — Peguy Jean Pierre
(74) *Attorney, Agent, or Firm* — Eschweiler & Associates, LLC

(57) ABSTRACT

A digital-to-analog converter for converting digital values to an analog output signal includes a first converter section and a second converter section operating at different conversion rates. A first analog signal provided by the first converter section and a second analog signal provided by the second converter section are combined to obtain the analog output signal. The concept may be used in fields of DAC applications where the sample rate is much higher than the signal bandwidth. The limited signal bandwidth means that the maximum change between two neighboring samples is a small fraction of the whole DAC range. The first converter section may cover a large range of values, whereas for the second converter section a relatively small range of values may be sufficient.

35 Claims, 21 Drawing Sheets

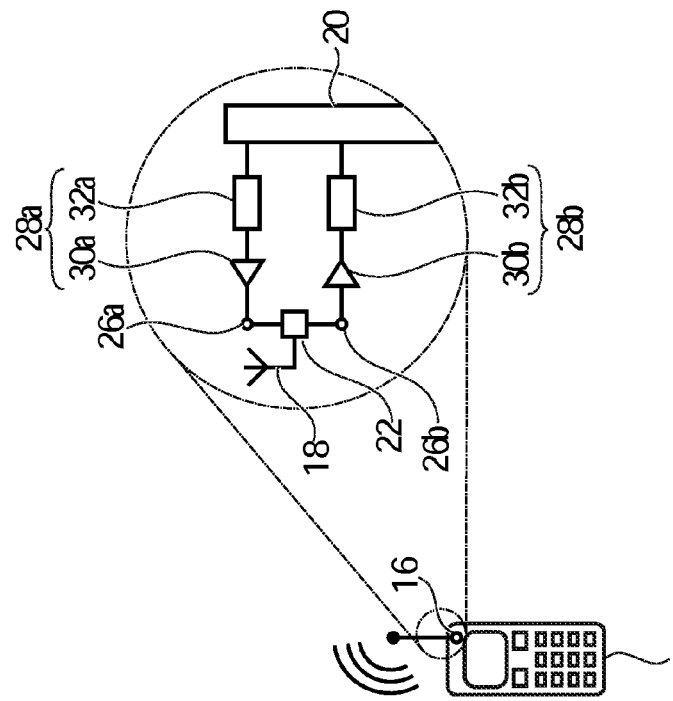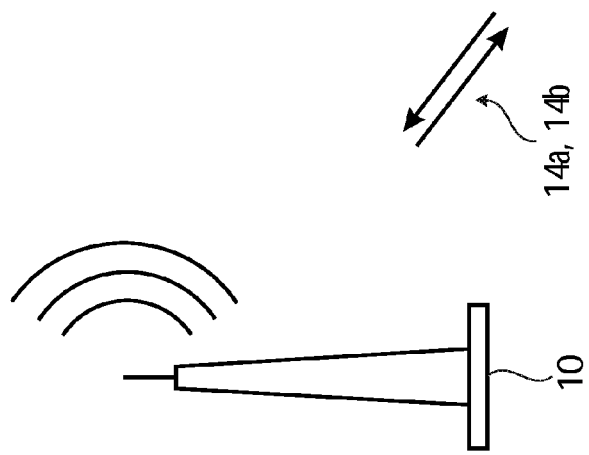
FIG 1

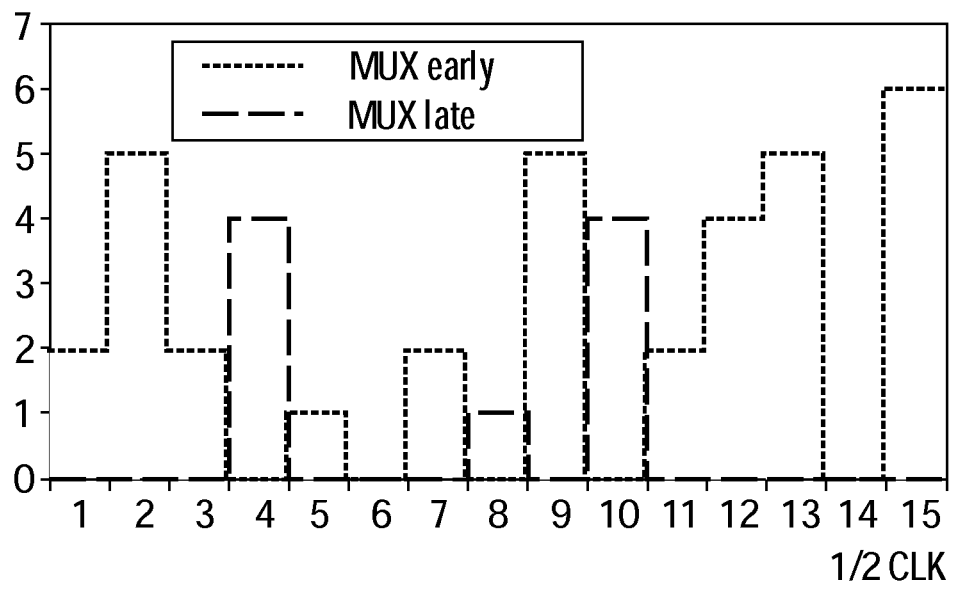
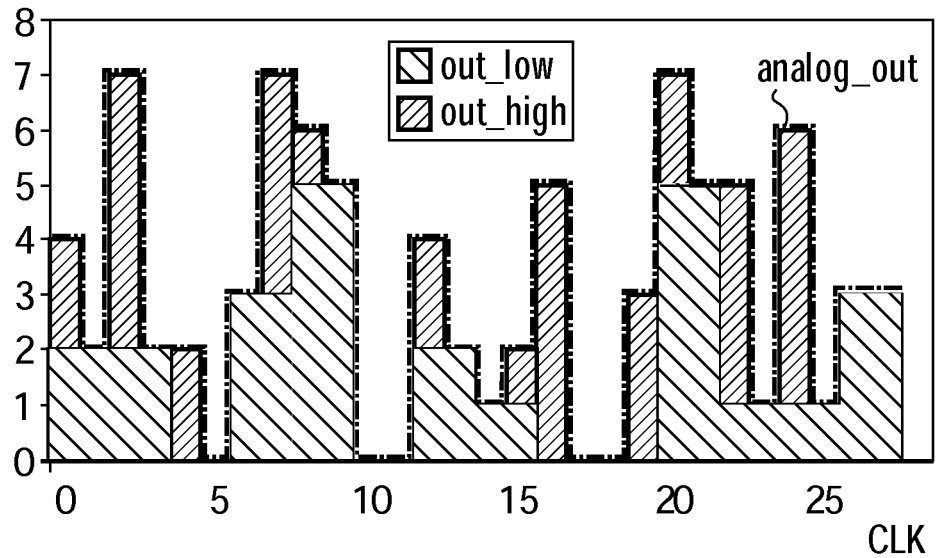
FIG 10B

DIGITAL-TO-ANALOG CONVERTER COMPRISING SLOW CONVERTER SECTION AND FAST CONVERTER SECTION

FIELD

The present disclosure is directed to a digital-to-analog converter and a method for converting digital values to an analog output signal.

BACKGROUND

Digital-to-analog converters are intended for and capable of converting a digital signal to a corresponding analog signal. When designing and/or selecting a digital-to-analog converter (DAC), it may be necessary to make a trade-off between several performance characteristics of the DAC. Some of the most important performance characteristics for DACs are: resolution, dynamic range, maximum sampling rate and, especially for battery-powered devices, power consumption.

Digital-to-analog converters are nowadays used in a vast variety of devices and for numerous applications. As an example, the field of wireless communication makes particularly high demands on DACs. For example, there is an ongoing demand for increased battery talk and standby time in wireless communication devices, i.e., between battery recharging periods. Efforts are being undertaken to design the power consumption of circuits in the communication devices to perform their functions while consuming a minimum amount of battery power. Reducing the power consumption also has the advantage that the amount of heat generated by the communication device is lower, which typically can be used to reduce efforts for cooling the communication device and/or to facilitate further integration and miniaturization of the communication device.

With the considerable recent growth in the demand for wireless services (e.g., personal communication services (PCS)), the operating frequency of wireless networks have increased and is now well into the gigahertz (GHz) range.

Current and upcoming standards for wireless communications (e.g. LTE) require the signal transmitted by the wireless communication device to have a relatively large dynamic range which calls for a corresponding DAC. High dynamic range DACs allow one to reduce external filtering requirements which may result in a reduction of the total size of the solution and enable support of the ever increasing number of bands of modern wireless communication standards (e.g., LTE).

SUMMARY

A digital-to-analog converter for converting digital values to an analog output signal comprises a first converter section and a second converter section operating at different conversion rates. A first analog signal provided by the first converter section and a second analog signal provided by the second converter section are combined to obtain the analog output signal.

BRIEF DESCRIPTION OF THE DRAWINGS

FIG. 1 shows a schematic block diagram of a communication system and a mobile communication device having a transceiver with an efficient DAC;

FIGS. 10A and 10B show waveforms of the various signals in the rate splitter according to FIG. 9;

DETAILED DESCRIPTION

Figure 3:
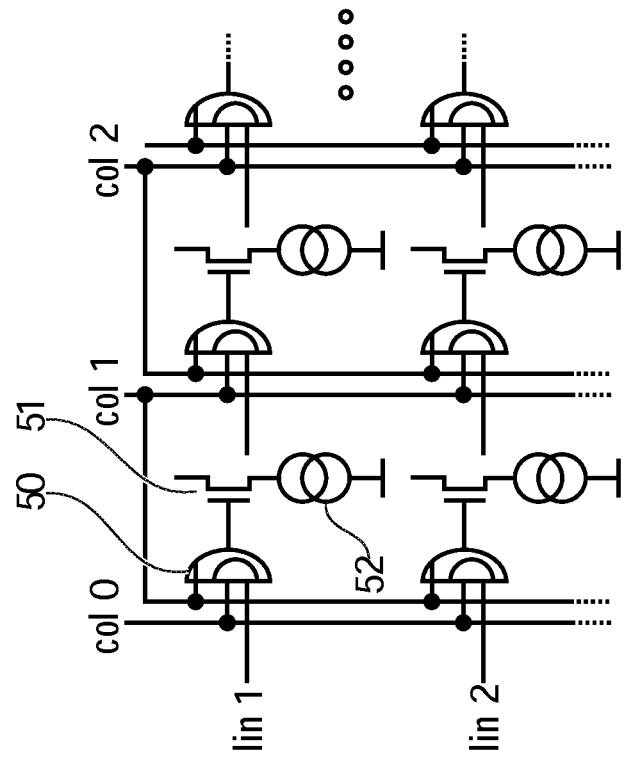
FIG. 3 shows a schematic circuit diagram of a portion of a thermometer encoded digital-to-analog converter.

FIG. 1 shows, in a schematic manner, a base station 10 and a mobile communication device 12 which are connected via a downlink port 14a and an uplink port 14b of an air interface. The mobile communication device 12 comprises a transceiver 16, an enlarged view of which is schematically shown in one embodiment.

The transceiver 16 is connected to an antenna 18 and comprises an analog frontend and a baseband processor 20. The analog front end comprises a signal divider element 22 (e.g., a circulator or duplexer), a transmitter 28a, and a receiver 28b. The transmitter 28a and the receiver 28b are arranged between the signal divider element 22 and the baseband processor 20. The transmitter 28a is connected to the divider element 22 via an interface 26. The transmitter 28a comprises an amplifier 30a and a DAC/mixer arrangement 32a which is arranged between the amplifier 30a and the baseband processor 20. The amplifier 30a of the transmitter 28a amplifies a signal provided by the DAC/mixer arrangement 32a and feeds it via the interface 26a to the divider element 22. The receiver 28b is connected to the divider element 22 via another interface 26b. The receiver 28b comprises, for example, a low noise amplifier 30b and a mixer/ADC (analog-to-digital converter) arrangement 32b which is arranged between the amplifier 30b and the baseband processor 20. The amplifier 30b of the receiver 28b may be a low noise amplifier (LNA) and is configured to amplify a signal received by the antenna 18 and forwarded to an input of the amplifier 30b via the signal divider element 22 and the interface 26b. The amplified signal output by the amplifier 30b be is fed to the mixer/AGC arrangement 32b for frequency downmixing, analog-to-digital conversion, and subsequent processing by the baseband processor 20.

Figure 2:
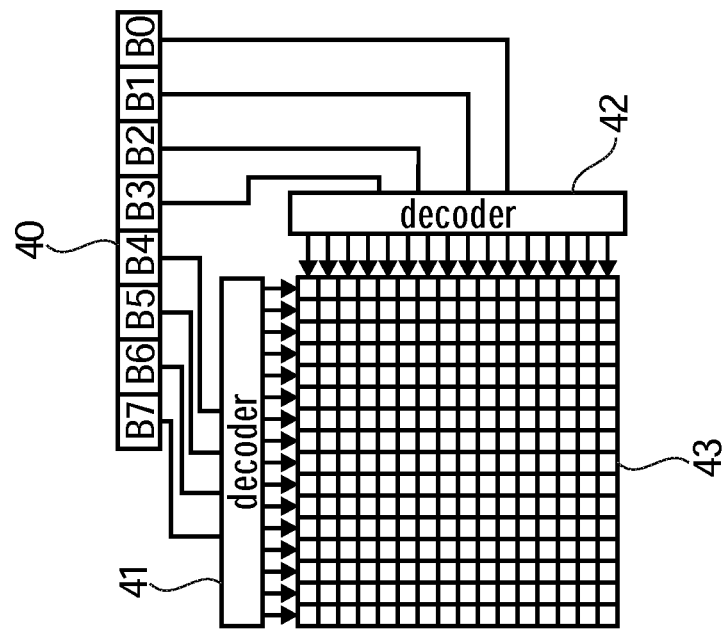
FIG. 2 shows a schematic block diagram of portions of a thermometer encoded digital-to-analog converter having an array architecture.
Figure 4:
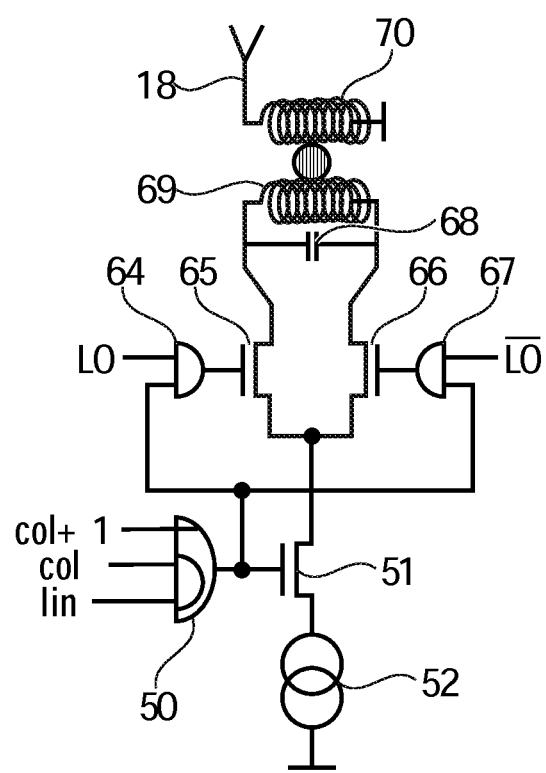
FIG. 4 shows schematic circuit diagram of a cell of a thermometer encoded mixing DAC.

The DAC/mixer arrangement 32a may comprise a digital-to-analog converter. As a special type of DACS, so-called radio frequency digital-to-analog converters (RF DACs) offer direct digital modulation of an radio frequency (RF) carrier. Intermediate analog signaling processing steps like alias filtering or mixing are omitted. Another term for RF DACs is mixing DACs. FIGS. 2 to 4 and the corresponding description provide a short introduction to an example possible implementation of mixing DACs. The digital to analog converter of FIG. 2 is a so-called thermometer encoded digital-to-analog converter.

An input 40 receives an eight bit signal, the bits being denoted B0 to B7 in FIG. 2. Bits B0 to B3 which may be the least significant four bits are fed to a thermometer decoder 42, while bits B4 to B7 are fed to a thermometer decoder 41. Thermometer decoders 42 and 41 control a cell array 43 which comprises $2^8-1$, i.e. 255, cells. Each cell when activated outputs the same output value, for example a predetermined current. The number of activated cells depends on the eight bit value B0 to B7. For example, if no bit is set corresponding to a (decimal) bit value of zero, no cell is activated so the output current is zero. On the other hand, if all bits are set corresponding to a decimal value of 255, all cells are activated to yield an output signal which essentially is 255 times stronger than the output of a single cell.

An example for a portion of cell array 43 is shown in FIG. 3.

In the example of FIG. 3 each cell comprises an ANDOR-gate 50, a transistor 51 acting as a switch and a current source 52 coupled between transistor 51 and ground. With "col" control lines arranged in columns and coupled to thermometer decoder 41 are denoted, while with "lin" control lines arranged in lines and coupled to thermometer decoder 42 are denoted. By setting the control lines, of which col0, col1 and col2 as well as lin1 and lin2 are shown in FIG. 3, to logic 1 or logic 0 by thermometer decoders 41, 42 of FIG. 2, cells may be selectively activated and deactivated.

As can be seen in FIG. 3, each ANDOR-gate 50 is coupled with two "col" lines and one "lin" line. For example, the ANDOR-gate bearing reference numeral 50 in FIG. 3 is coupled with col0, col1 and lin1. ANDOR-gate 50 links the "col" input with the lower number with the "lin" input using a logic AND and links the result with the "col" input with the higher number with a logic OR in the above example (col0 AND lin1) OR col1.

Therefore, when col0 and lin1, col1 or all inputs in the example of FIG. 3 are set to logic 1, ANDOR-gate 50 outputs a logic 1 switching transistor 51 to a conducting state between its source and drain terminals. In this case, the current of current source 52 contributes to the output of the digital-to-analog converter. On the other hand, if in the example of FIG. 3 one of col0, and lin1 is set to logic 0, and col1 is set to logic 0, ANDOR-gate 50 outputs a logic 0, switching transistor 51 to a non-conducting state between source and drain. In this case, current source 52 does not contribute to the output of DAC. Therefore, by controlling the "col" lines and the "lin" lines accordingly, the current sources or in other words the cells may be selectively activated or deactivated as described before. It is to be noted that the above-described control logic using ANDOR-gate 50 is only one example for a control logic, and other implementations are equally possible.

While with reference to FIGS. 2 and 3 an example for a fully thermometer encoded DAC has been shown, other DAC architectures may only be partially thermometer decoded, or not thermometer encoded. For example, for a 10 bit DAC, the eight most significant bits may be thermometer encoded, using for example the structure of FIG. 2, and for the two least significant bits two additional cells may be provided, which for example may each comprise a current source and a transistor acting as a switch similar to the cells shown in FIG. 3. For the least significant bit, the current source may have a current output ¼ of the current output of each of current sources of an array of cells of the thermometer encoded portion, and for the second least significant bit the current output of the current source may be ½ the current of each of the current sources of the cells of the array of the thermometer encoded portion. The control transistors for these two cells are directly controlled by the bits, i.e., the least significant bit and the second least significant bit in the above example (binary weighted DAC).

To form a mixing DAC, each cell of a DAC may comprise a mixer, which is not shown in FIG. 3, but examples for which will be explained below with reference to FIG. 4. It is also possible that only cells of a thermometer encoded portion may have their own assigned mixer, and cells of a non-thermometer encoded portion may have a common mixer.

In FIG. 4, an exemplary DAC cell is shown. The DAC cell in the example of FIG. 4 may for example be a cell of the array of cells 43 of FIG. 2, but is not limited thereto. A current source 52, a transistor 51 and an ANDOR-gate 50 are provided. Current source 52 is coupled between transistor 51 and ground, and an output of ANDOR-gate 50 is coupled to a gate terminal of transistor 51 such that transistor 51 is switched between a conducting state and a non-conducting state depending on the output of ANDOR-gate 50. In other words, in case of MOS transistors as shown the gate terminal serves as a control terminal of the transistor. Similar to what was explained with reference to FIG. 3, ANDOR-gate 50 comprises three inputs, one of a "lin" line and two from adjacent "col" lines. The output of ANDOR-gate 50 corresponds to (lin AND col) OR col+1. In other implementations, other logic gates and logic circuits may be used instead of ANDOR-gate 50.

A second terminal of transistor 51 is coupled with a mixer, which in the example shown in FIG. 4 comprises two transistors 65, 66 acting as switches. A gate terminal of transistor 65 is coupled with an output of an AND gate 64, and a gate terminal of transistor 66 is coupled with an output of an AND-gate 67.

A first input of AND gate 64 is coupled with a local oscillator signal LO, and a second input of AND gate 64 is coupled with the output of ANDOR gate 50. A first input of AND gate 67 receives the local oscillator signal in inverted form, denoted with LO in FIG. 4, and a second input of AND gate 67 is coupled with the output of ANDOR gate 50.

Therefore, if the cell shown in FIG. 4 is not activated, i.e., ANDOR gate 50 outputs a logic 0, AND gates 64, 67 and irrespective of the state of the local oscillator signal output a logic 0 and therefore set transistors 65, 66 to a non-conducting state. Therefore, in FIG. 4 AND gates 64, 67 act as switching circuitry decoupling the local oscillator signal from the mixer when the cell is deactivated, which in turn is based on an input digital signal of the respective digital-to-analog converter.

On the other hand, when the cell illustrated in FIG. 4 is activated, transistor 51 is conducting, thus supplying the current from current source 52 to the mixer, i.e., transistors 65 and 66. In this case, when the local oscillator signal LO is logic 1, transistor 65 is conducting and transistor 66 is non-conducting, and when the local oscillator signal LO is logic 0, transistor 65 is non-conducting and transistor 66 is conducting. Therefore, the current source 52 is switched between transistor 65 and transistor 66 and thus mixed with the frequency of the local oscillator signal.

The output of the cell, i.e. transistors 65 and 66, are coupled with a transformer comprising an inductance 69 and a capacitance 68 on a side of the cell and a inductance 70 on a side of an antenna 18. It should be noted that elements 68 to 70 and antenna 18 are not part of the cell, but merely serve as an example for elements to which the output of the cell may be coupled. It should also be noted that in some alternative arrangements all cells of a digital-to-analog converter are coupled to elements 68 to 70 and antenna 18. In further possible arrangements, additional (not shown) elements may be provided between the cells and elements 68 to 70 or other elements for which the signal of the digital to analog converter is intended.

Typically, the optimum input sample rate for an RFDAC equals the RF carrier frequency. Then all alias spectra are located on images of the carrier, yielding good performance. However for high RF carrier frequencies (e.g. 2 GHz) the resulting power consumption of generating, distributing and decoding signals at the full RF carrier rate is prohibitively high for mobile usage in current process technologies.

One method is to run the sample rate of the DAC at an integer fraction 1/n of the RF carrier frequency. Each input sample is held constant for n RF cycles. This reduces the power of the digital processing and decoding of the RFDAC by a factor of n compared to a full rate implementation. However this creates alias spectra at integer multiples of the DAC's sampling rate. As there is no or very limited analog filtering in an RFDAC, these alias spectra will be seen directly at the RFDAC output. For low signal bandwidth the intrinsic $\sin(x)/x$ transfer function of a $1^{st}$ order hold interpolation will offer sufficient attenuation of the aliases. For higher bandwidth the rejection is not sufficient and external RF filters would be required to remove the aliases.

In RFDAC implementations, where the DAC output to the RF mixer is accessible as a separate node, analog filtering, i.e. integration, can be added to implement and provide the necessary attenuation of the aliases. However, in digitally centric implementations such a node may not exist or adding of analog filtering may be generating a lot of effort, area and power consumption. For example, in a structure as shown in FIG. 4, every cell comprises an analog current output node at the output of the switch 51 requiring an analog filter, i.e., 256 times in the illustrated example of FIG. 4. In a different implementation, where the current is summed into one mixer, one could have one analog filter.

The concepts described in more detail below are capable of reducing the high power consumption of the RFDAC digital logic, if the sampling rate equals the RF frequency. The power consumption can be reduced close to that of an 1/n down-sampled implementation but still provides the full RF frequency input rate. Alias rejection is determined by the digital filtering used to generate the full frequency signal. No analog postfiltering is required to achieve good performance.

The concepts are based on the observation, that in RFDAC applications the signal bandwidth of the DAC input is much lower (i.e. 20 MHz for LTE20) than the RF frequency/DAC sample rate (2 GHz). The limited signal bandwidth means that the maximum change between two neighboring samples is a small fraction of the whole DAC range. For sufficiently low bandwidth, also the difference between maximum and minimum in a group of n samples is a small fraction of the DAC range. At least one aspect relates to a low power, full local oscillator (LO) input rate RFDAC. The concept can also be used in fields of DAC applications where the sample rate is much higher than the signal bandwidth.

Figure 5:
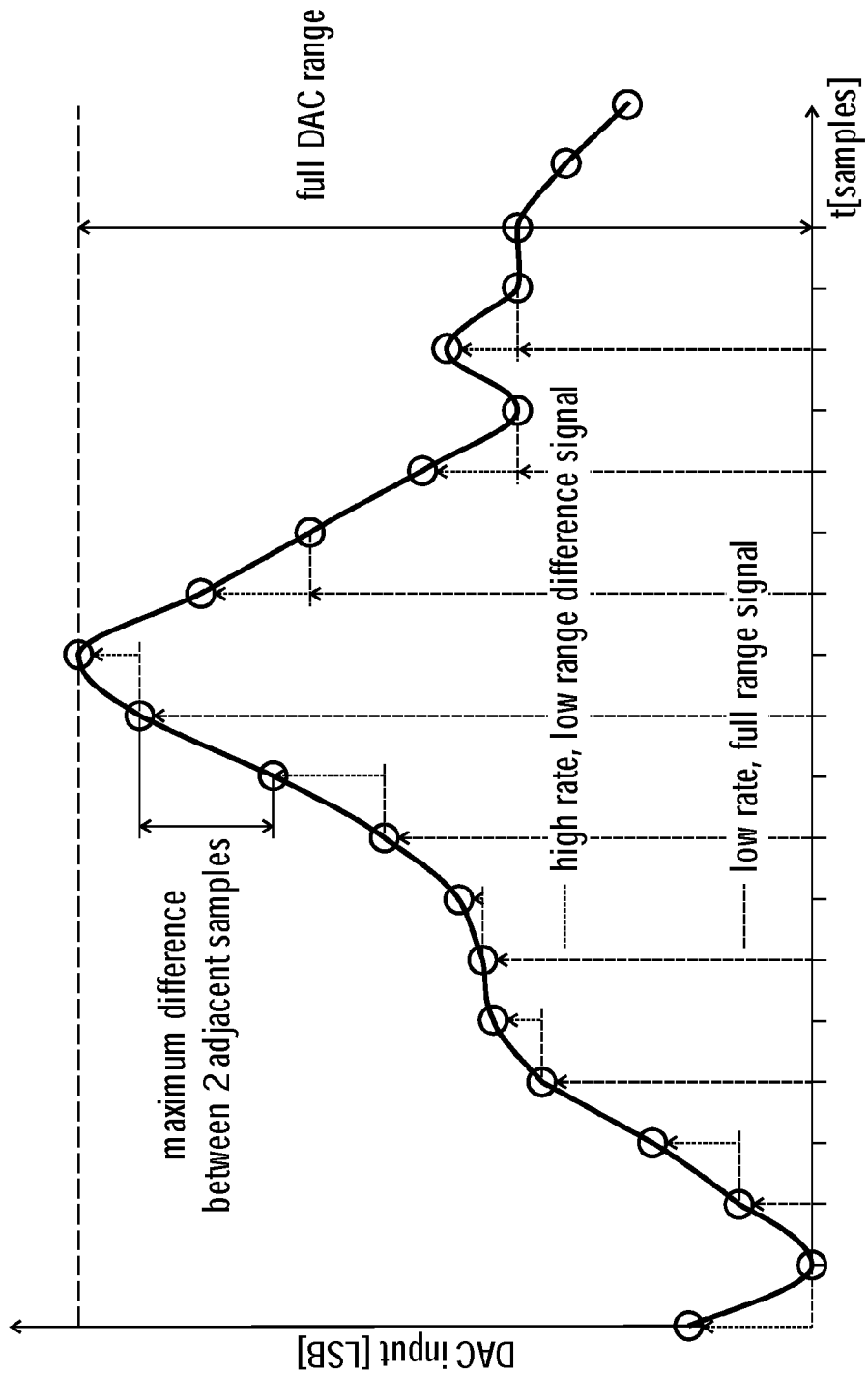
FIG. 5 schematically illustrates a waveform of a digital signal to be converted and a possible decomposition of the signal in a low rate, full range signal and a high rate, low range difference signal.

This property can be exploited to split the signal into a 1:n rate signal covering the complete DAC range and a full rate difference signal with a small range covering the maximum difference between maximum and minimum within the group of n samples. In FIG. 5, the dashed arrows indicate the 1:n rate signal covering the complete DAC range (low rate, full range signal) and the dotted arrows indicate the full rate difference signal (high rate, low range difference signal). In FIG. 5, the factor n has been chosen to be n=2, but in general, n may be an integer greater than 2, e.g., n=3, 4, 5, 8, 10, 16, . . . . The full rate difference signal should typically have a sufficiently large dynamic range so that it can cover the maximum difference between two adjacent samples (in general: between n adjacent samples).

As bigger DAC range is related to bigger die area, more bits, more complex decoders, longer interconnects and stronger interconnect drivers, DAC digital logic power consumption scales with DAC range. By keeping the range of the DAC running at full rate small, the additional power consumption compared to a 1:n downsampled implementation can be made small.

The following observations and ideas may be helpful for an understanding of the concept(s):

The signal bandwidth is small compared to the DAC sample rate (which, in the special case of a mixing DAC, matches the RF frequency)

Therefore the difference between n adjacent DAC samples is small compared to the DAC range n adjacent samples can be described as a sum of a large constant part (temporarily constant portion) and a small varying part The large constant needs to be updated every n-th RF cycle The small varying part needs to be updated every RF cycle Large parts of the digital decoding in the DAC can run on a low rate and power and only a small part needs to run at full frequency The low rate part can also be run at coarse quantization to save additional power The DAC decoder is, for example, partitioned into a large low and a small high rate part. Thus, a full RF frequency DAC input sample rate is achieved at power levels close to undersampled implementations, eliminating the need of any analog filtering within the DAC.

Figure 6:
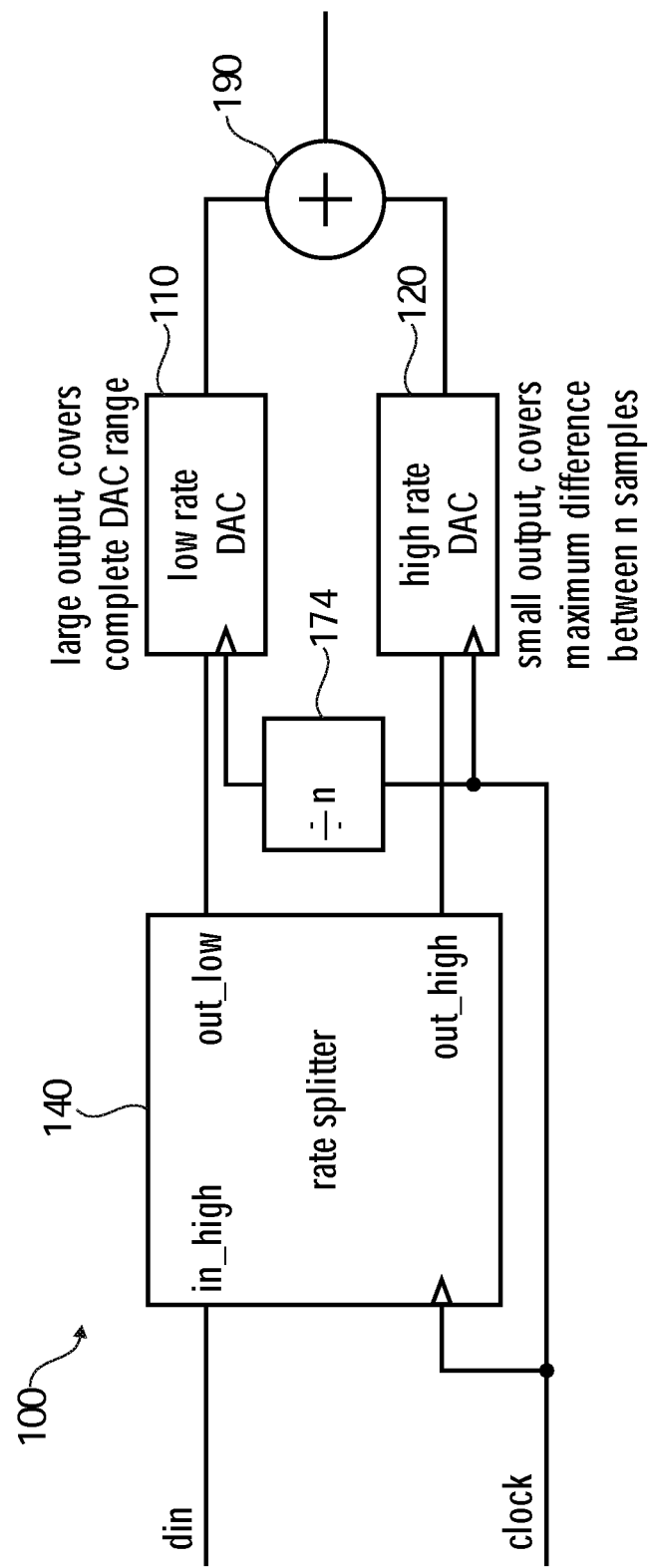
FIG. 6 shows a schematic block diagram of an architecture comprising a rate splitter or digital value splitter, a low rate DAC, a high rate DAC, and a combiner.

FIG. 6 shows, as an example of a possible implementation, a schematic block diagram of the architecture of a DAC 100 having distinct converter sections 110, 120 operating at different conversion rates. In particular, the DAC 100 comprises a first converter section 110 (relatively slow, but having a large range) and a second converter section 120 (relatively fast, but having a small range). The first converter section 110 is configured to convert a temporarily constant portion of a sequence of the digital values at a first conversion rate to a first analog signal. The temporarily constant portion is constant for at least one conversion period of the first converter section 110. In some examples described below, the first converter section 110 may be referred to as a low rate converter section. The second converter section 120 is configured to convert a second portion of the digital values at a second conversion rate to a second analog signal, wherein the second conversion rate is higher than the first conversion rate. In some examples, the second converter section 120 may be referred to as a high rate converter section 120. The first converter section may be configured to cover a first range of values and the second converter section may be configured to cover a second range of values that is smaller than the first range of values. Such a DAC may be used for converting a signal having a relatively small bandwidth compared to a sample rate: the signal can be divided in a slow signal with large amplitude and a fast signal with small amplitude. The slow signal with large amplitude can be converted at a relatively low rate and a current consumption of the corresponding first converter section may thus be reduced.

The DAC 100 further comprises a signal combiner 190 configured to combine at least the first analog signal and the second analog signal to obtain the analog output signal. The DAC 100 operates as follows: Input data din is delivered at the DAC input at full rate. A rate splitter circuit 140 divides the signal into two data streams, one running at full and one running at 1/n-th of the sample rate. Both signals are processed by separate DACs (converter sections) 110, 120 running on the different frequencies. The low rate DAC 110 covers the complete DAC output range, the high rate DAC 120 covers the maximum difference of n adjacent samples. Outputs of the two DACs are added in the analog domain. In current steering DACs this is accomplished by connecting the two DACs 110, 120 in parallel. The rate splitter 140 may also be referred to as a digital value splitter that is configured to split the sequence of digital values to be converted during a given conversion period of the first converter section 110 into the temporarily constant portion and a sequence of second portions.

Figure 7:
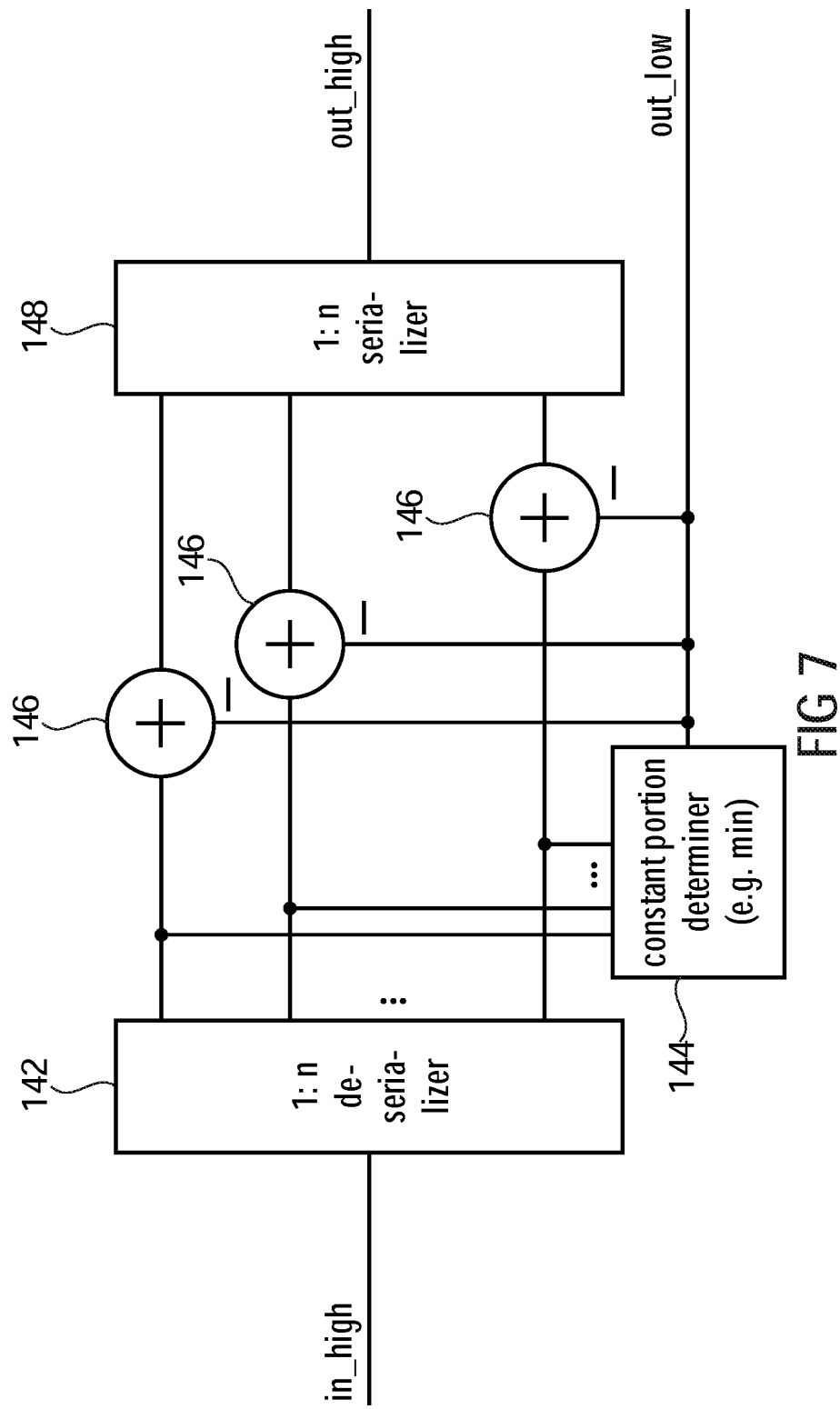
FIG. 7 shows a schematic block diagram of a rate splitter having a parallel configuration.

A possible schematic of the rate splitter circuit 140 is given in FIG. 7. The full rate input data stream in_high is deserialized by a 1:n deserializer 142 into n parallel streams of rate 1/n. The deserializer may comprise a digital value storage that is configured to store the sequence of digital values to be converted during the conversion period of the first converter section. The temporarily constant portion of the n streams is provided by a constant portion determiner 144 as a temporarily constant portion signal out_low at the first sample rate. A special case of the constant portion determiner 144 may be a minimum determiner. The constant portion determiner may be configured to determine the temporarily constant portion as a function (e.g., first sample, minimum, maximum, average, median, (max-min)/2, etc.) of the digital values stored in the digital value storage. For example, a minimum determiner may be used if the fast/low range DAC can only process positive signals, i.e., it can only add a current/voltage. Then the slow/large range DAC needs to generate the lowest value in order for the fast DAC to be able to reach the target by adding a positive current/voltage. In contrast, if the fast DAC has a sign, i.e., it can also subtract values, one of the other constant determiners can also be used instead of the minimum determiner. The temporarily constant portion (which may be a minimum value) is subtracted from each stream using a plurality of subtractors 146 to obtain the differences which have to be added by the high rate DAC 120. The adjusted streams need to be serialized by a 1:n serializer 148 to a high rate output out_high for the high rate DAC 120. The plurality of subtractors 146 form a subtracting unit. Each of the subtractors 146 is configured to subtract the temporarily constant value from a corresponding digital value stored in the digital storage to provide the corresponding second portion of the sequence of second portions.

Figure 8:
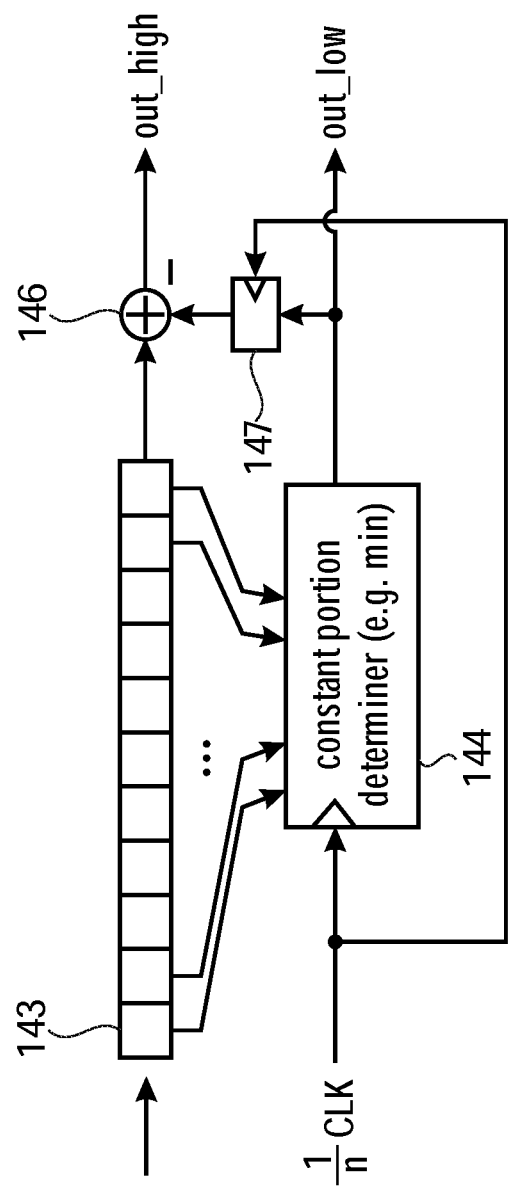
FIG. 8 shows a schematic block diagram of a rate splitter having a serial configuration.

FIG. 8 shows a schematic block diagram of a serial implementation of the rate splitter circuit 140. The full rate input data stream in_high is buffered in a shift register 143. The shift register 143 is typically configured to buffer the digital values of one first or long conversion period of the first converter section 110. When the digital values corresponding to the same long conversion period have been completely loaded into the shift register 143, the constant portion determiner 144 may be triggered by the frequency divided clock signal to perform a determination of the temporarily constant portion (e.g., a minimum determination). The temporarily constant portion for this long conversion period is then fed to a latch 147 which provides it as a negative input to the subtracting unit comprising a (single) subtractor 146. When the shift register 143 is read out, the minimum value provided by the latch 147 is subtracted from each digital value, resulting in the second rate output out_high.

Figure 9:
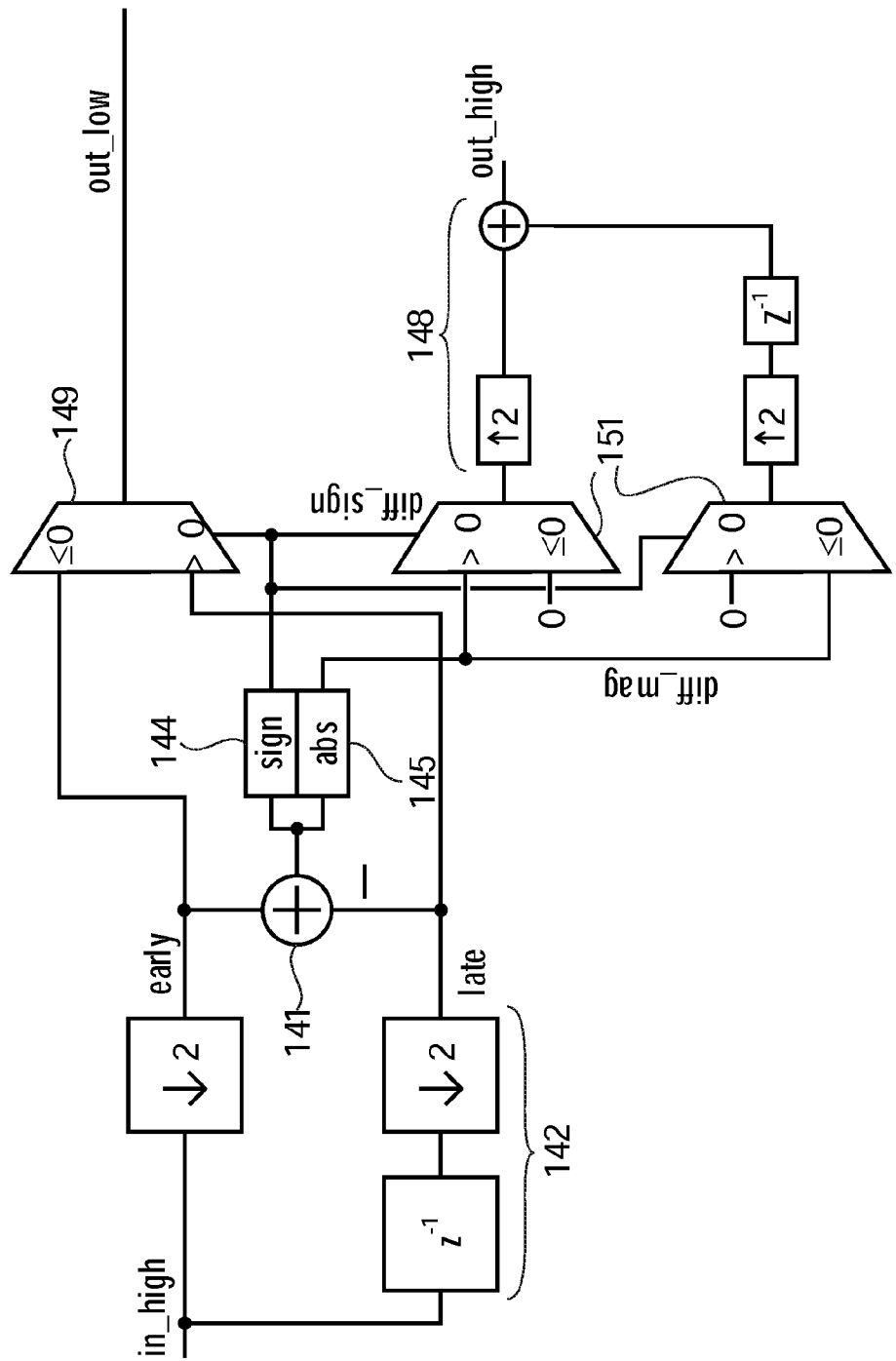
FIG. 9 shows a schematic block diagram of a possible rate splitter for the special case in which the second converter section operates at double the conversion rate than the first converter section.

For the special case n=2, the circuit in FIG. 7 may be simplified as schematically illustrated in FIG. 9. The input signal in_high is deserialized into two parallel data streams "early" and "late". If the sign of the difference between early and late determined by the subtractor 141 and the sign checker 144 (which fulfills the functionality of the minimum determiner) is positive, then "late" is the smaller signal going to the low rate DAC 110, i.e., the signal out_low will assume the value of the signal late. Otherwise "early" is chosen as the first rate offset out_low. This is achieved by a multiplexer 149 controlled by the output diff_sign of the sign checker. The high rate adder for the smaller value is 0, the other is the absolute value of the difference "diff_mag" determined by the absolute value determiner 145. If the early signal has the smaller value, the high rate output is 0 followed by diff_mag. If the late signal is the smaller one, diff_mag has to be sent to the high rate DAC first, followed by 0. This functionality is provided by two multiplexers 151 controlled by diff_sign.

In some implementations the difference between two adjacent signals may be already available from the circuit generating the signal. Then the implementation reduces to the multiplexing and serializing.

Figure 10A:
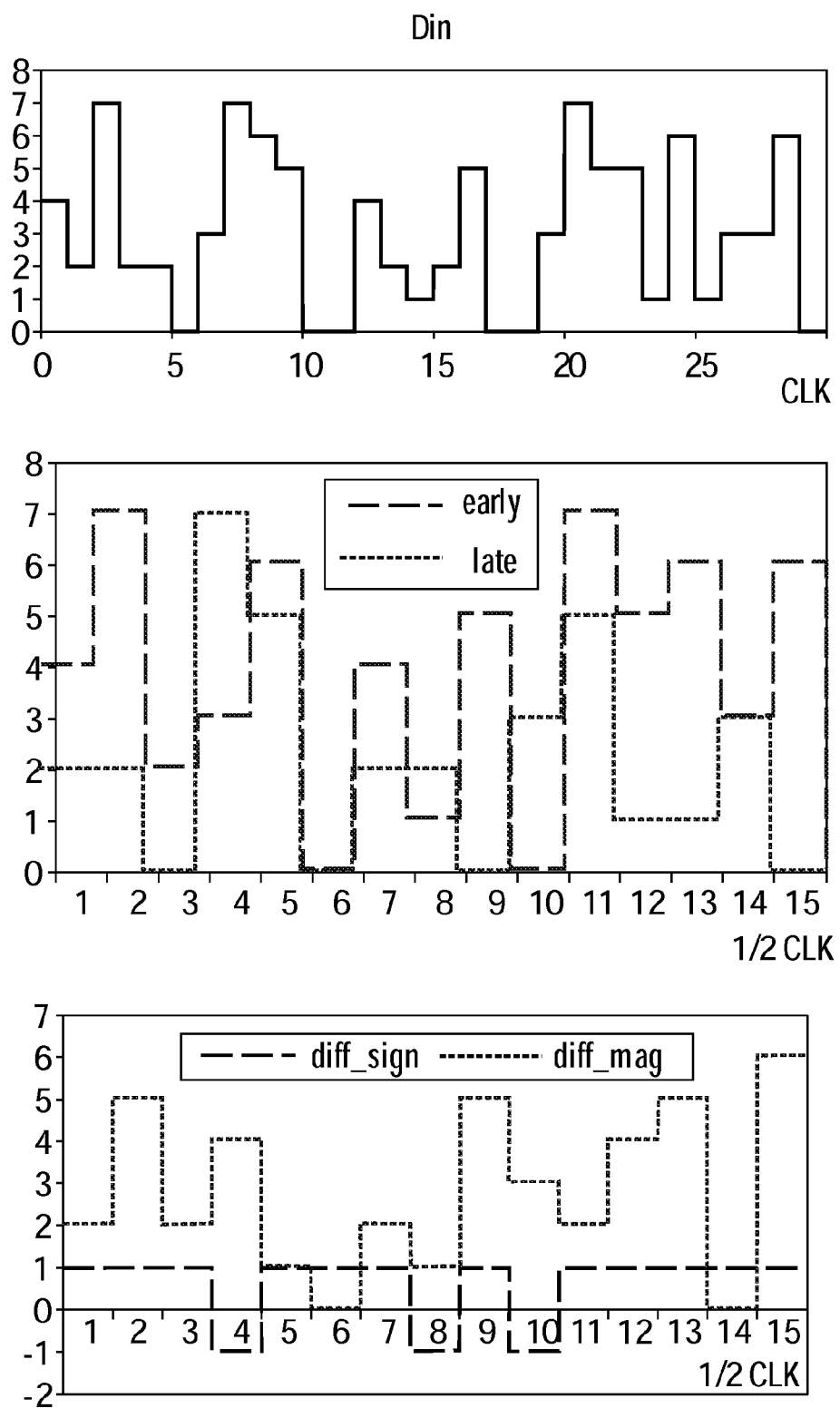

FIGS. 10A and 10B schematically illustrate exemplary signals that are processed by the circuit shown in FIG. 9. The upper diagram in FIG. 10A shows the input signal in_high as a digital signal with the possible values 0, 1, 2, . . . 7. The middle diagram in FIG. 10A shows how the input signal in_high is decomposed in the early and late signals. Note that the signals early and late are at half the clock rate (½ CLK) of the input signal and that they are constant during one clock cycle. The lower diagram in FIG. 10A shows the signals diff_sign and diff_mag.

The upper diagram in FIG. 10B shows the two outputs of the demultiplexer 151. The lower diagram in FIG. 10B shows the low rate output signal out_low and the high rate output signal out_high. By superposing out_low and out_high the desired analog output signal that represents the digital input signal in_high can be obtained.

Figure 11:
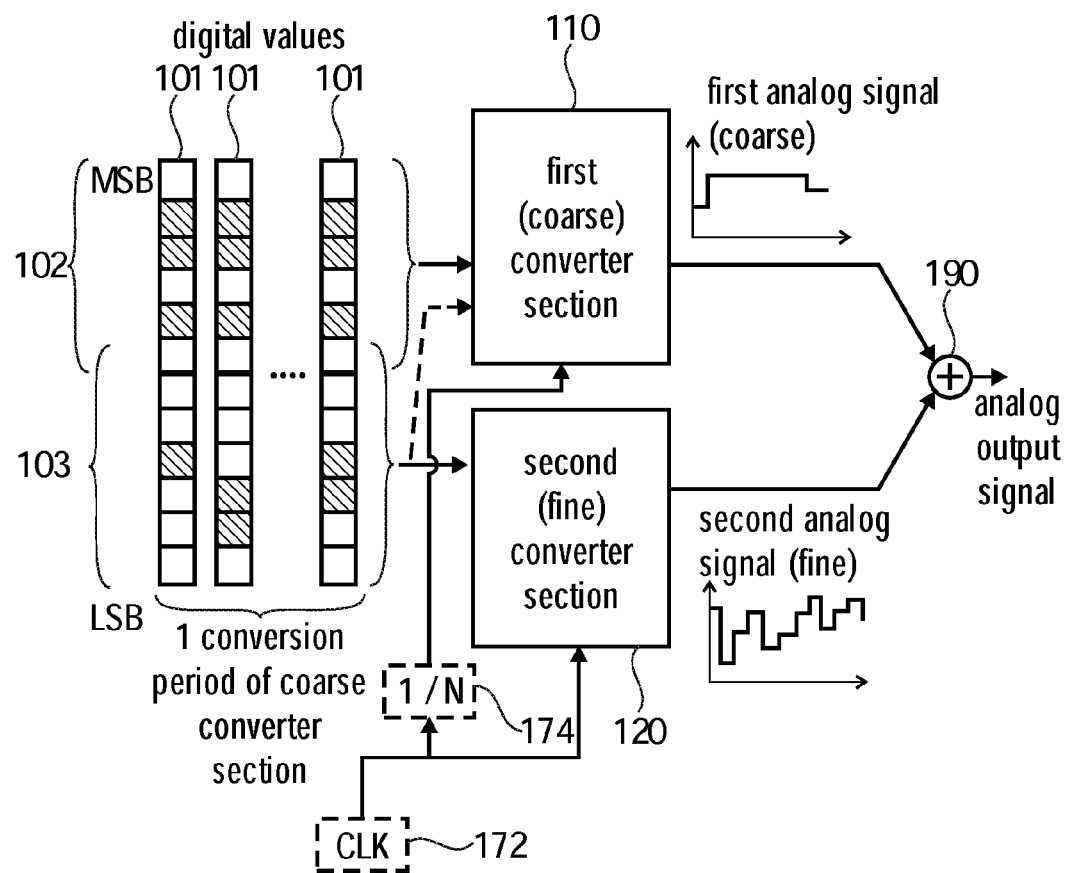
FIG. 11 shows a schematic block diagram of a digital-to-analog converter comprising a coarse converter section and a fine converter section.

The principle can be modified by using a coarse quantization for the low rate DAC as illustrated in FIG. 11. FIG. 11 shows a schematic block diagram of a digital-to-analog converter 100 for converting digital values 101 to an analog output signal. The DAC 100 comprises the first converter section 110, the second converter section 120, and a signal combiner 190. The first converter section 110 is provided for a coarse converting of the digital value and is configured to convert a temporarily constant (coarse) portion 102 of a sequence of the digital values 101 at a first conversion rate to the (coarse) first analog signal. The temporarily constant portion 102 is constant for at least one conversion period of the first converter section 110. The temporarily constant portion 102 may consider a most significant bit (MSB) of the digital values 101 (whether the MSB is set to logic high or logic low). In the depicted example, the temporarily constant portion 102 comprises six bits in total, of which three bits are set to logic high (indicated by the hatching), and the three remaining bits are set to logic low. One conversion period of the first converter section 110 typically extends over a sequence of n digital values 101. The relation between the conversion period of the first converter section 110 and the first conversion rate is, for example:

conversion period=1/first conversion rate.

It is sufficient to provide one temporarily constant portion 102 per coarse conversion period to the coarse converter section 110, i.e., the input rate of the coarse converter section 110 may be equal to the first conversion rate. The coarse converter section may be configured to also receive a temporarily constant portion of the fine portion 103, as indicated by the dashed arrow, if the coarse converter section has a bit resolution higher than the number of bits forming the temporarily constant portion 102. In this manner, the first converter section 110 may convert at least some of those bits of the second portion 103 that are constant during the current conversion period of the first converter section 110 and leave the remaining varying bits in the second portion 103 to the second converter section 120. Note that the temporarily constant portion 102 and the second portion 103 are assumed to be already in a format that is compatible with the first converter section 110 and the second converter section 120. To this end, an actual input signal to be converted may have undergone some prior reformatting, rearrangement, or recalculation resulting in the temporarily constant portion 102 and the second portion 103, if necessary for obtaining the desired property of temporary constancy for the temporarily constant portion 102.

The second converter section 120 is configured to convert a second portion 103 (fine portion) of the digital values at a second conversion rate to a second analog signal (fine analog signal). The second conversion rate is higher than the first conversion rate, i.e., the second converter section 120 typically operates faster than the first converter section 110. The second portions 103 may vary within the sequence of digital values 101 during the conversion period of the first converter section 110. In the depicted example, the second portion 103 of each of the digital values 101 comprises seven bits. Note that the second portion 103 overlaps with the first portion 102 by one overlap bit. During operation of the DAC 100 situations may occur in which, during one conversion period of the first converter section 110, the overlap bit varies. Hence, the overlap bit cannot be part of the temporarily constant portion for the given conversion period, but needs to be converted by the second converter section 120 at the higher second conversion rate instead.

The signal combiner 190 is configured to combine at least the coarse, first analog signal and the fine, second analog signal to obtain the analog output signal.

The DAC 100 may further comprise a clock generator 172 and/or a clock divider 174 configured to provide a high rate clock signal to the second converter section 120 and a frequency divided clock signal to the first converter section 110.

Figure 12:
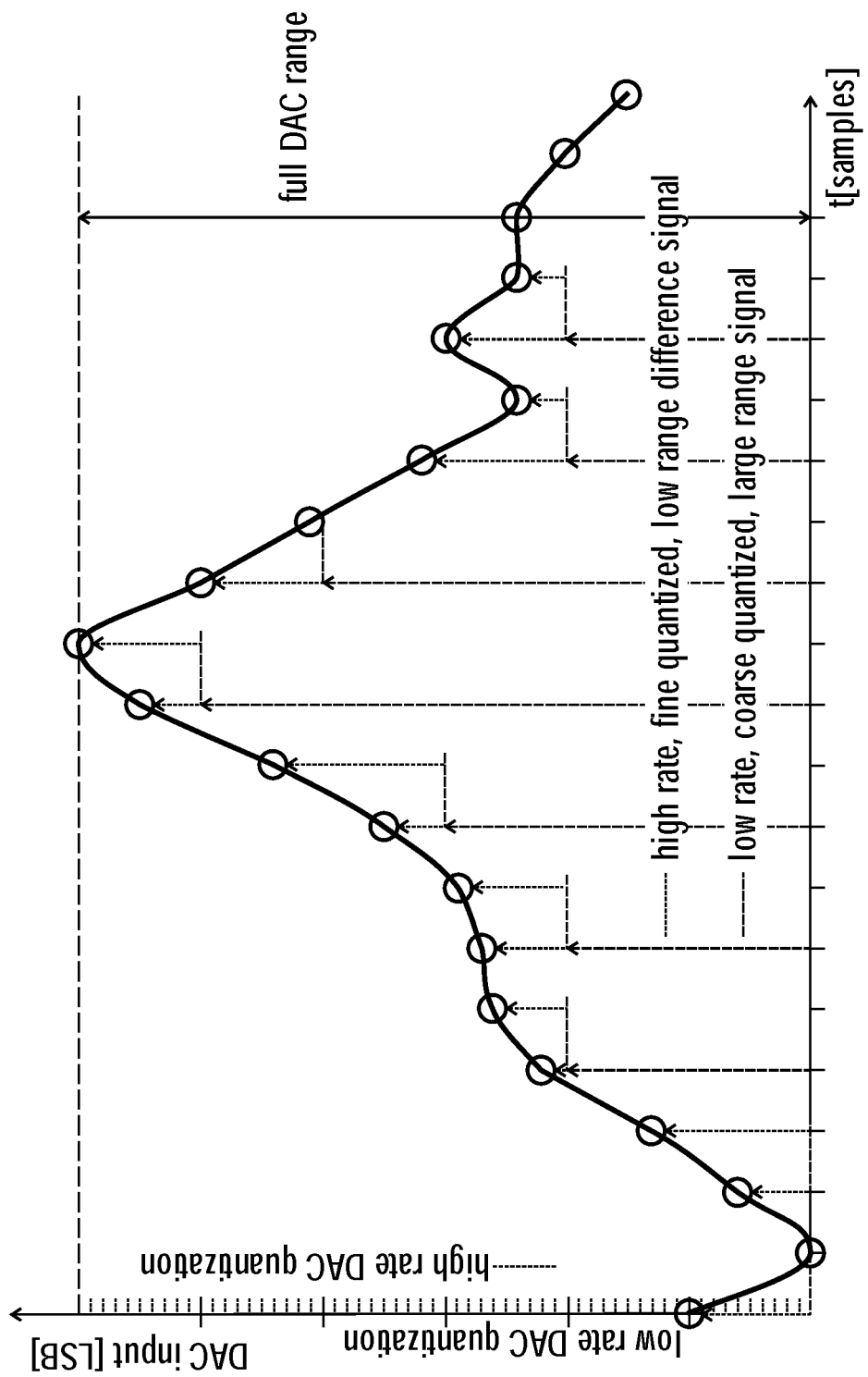
FIG. 12 illustrates a waveform of the digital input signal and a possible decomposition in a low rate, coarse quantized, large range signal and a high rate, fine quantized, low range difference signal, i.e., when using a coarse quantization for the low rate DAC.
Figure 13:
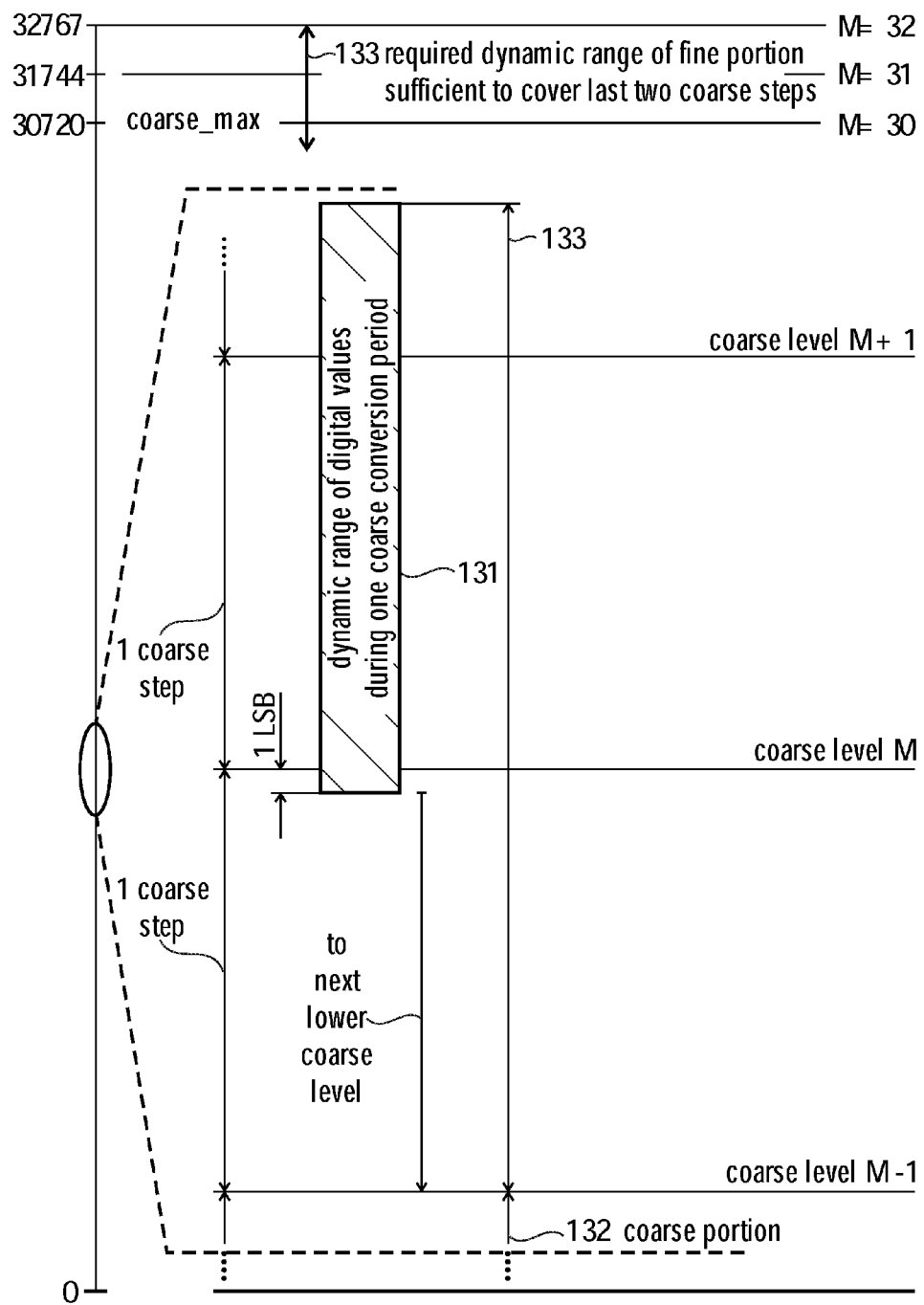
FIG. 13 schematically illustrates various dynamic ranges.

Referring now to FIG. 12, the slowly varying high range offset is quantized with a coarse resolution. The high rate DAC 120 adds the difference from this coarse quantized value to the actual samples. Therefore the high rate DAC value is typically larger than zero for the minimum sample within each group of n samples. The range of the high speed difference DAC 120 has to increase compared to the solution before. It has to cover the maximum difference of n adjacent samples plus one Coarse DAC step. In the worst case the minimum sample in the n group is located one LSB (least significant bit) below the next coarse step. And the difference between this minimum and the maximum can reach the highest value. Therefore the high rate DAC 120 needs to cover the sum of both. FIG. 13 schematically illustrates this. The DAC may be configured to convert digital values from 0 to 32767 corresponding to a 15 bit resolution. This dynamic range of the DAC is shown in the left part of FIG. 13. The right part shows an enlarged view of the portion of the dynamic range between coarse level M−1 and coarse level M+1. The hatched rectangle 131 corresponds to the limited dynamic range of the input signal during one coarse conversion period. When we assume that during a particular coarse conversion period the smallest value is only one LSB smaller than the coarse level M, then the next lower coarse quantization level M−1 needs to be chosen as the temporarily constant coarse portion 132. Accordingly, the required dynamic range 133 to represent the fine portion even in this situation is the difference between the uppermost value of the hatched rectangle 131 (dynamic range of digital values during one coarse conversion period) and the coarse level M−1. Therefore, the required dynamic range 133 of the fine portion spans more than two coarse quantization steps. This can be taken into account at the upper end of the total dynamic range of the DAC, because the last coarse quantization level that the coarse converter section needs to be able to produce in the present example is the $30^{th}$ level corresponding to a digital value of 30720. The remaining two coarse quantization steps can be covered by the fine portion. The difference between the maximum value and coarse_max is the length of the arrow 133 ("required dynamic range to represent fine portion") quantized to the next lower coarse level, i.e., if the fine dynamic range would be 3000 LSB and a coarse step is 1024 LSB, then coarse_max would be maximum-2048 LSB.

Figure 14:
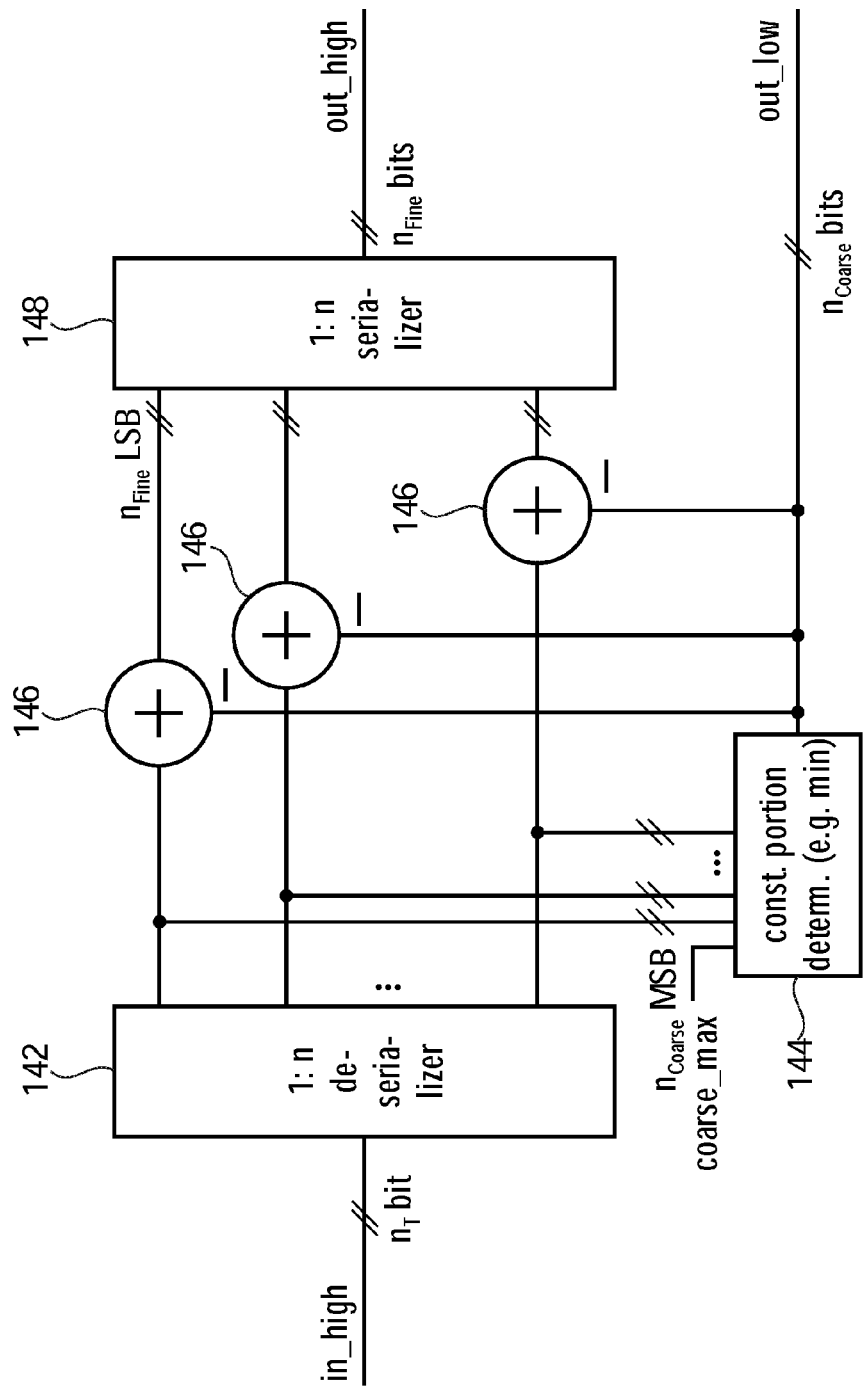
FIG. 14 shows a schematic block diagram of a rate splitter when using a coarse quantization for the low rate DAC.

A possible implementation of the rate splitter circuit for this approach is shown in FIG. 14.

The basic approach is the same as in FIG. 7. One difference is that the constant portion calculation performed by the constant portion determiner 144 can be done on the coarse quantization level of the low rate DAC 110. This reduces complexity and power consumption significantly compared to the previous proposal, where this function runs on the full bit width. The constant portion determiner 144 (e.g., minimum determiner) thus has a bit width that is smaller than a bit width of the digital values and is configured to determine the constant value based on the most significant portion of the digital values.

Figure 15:
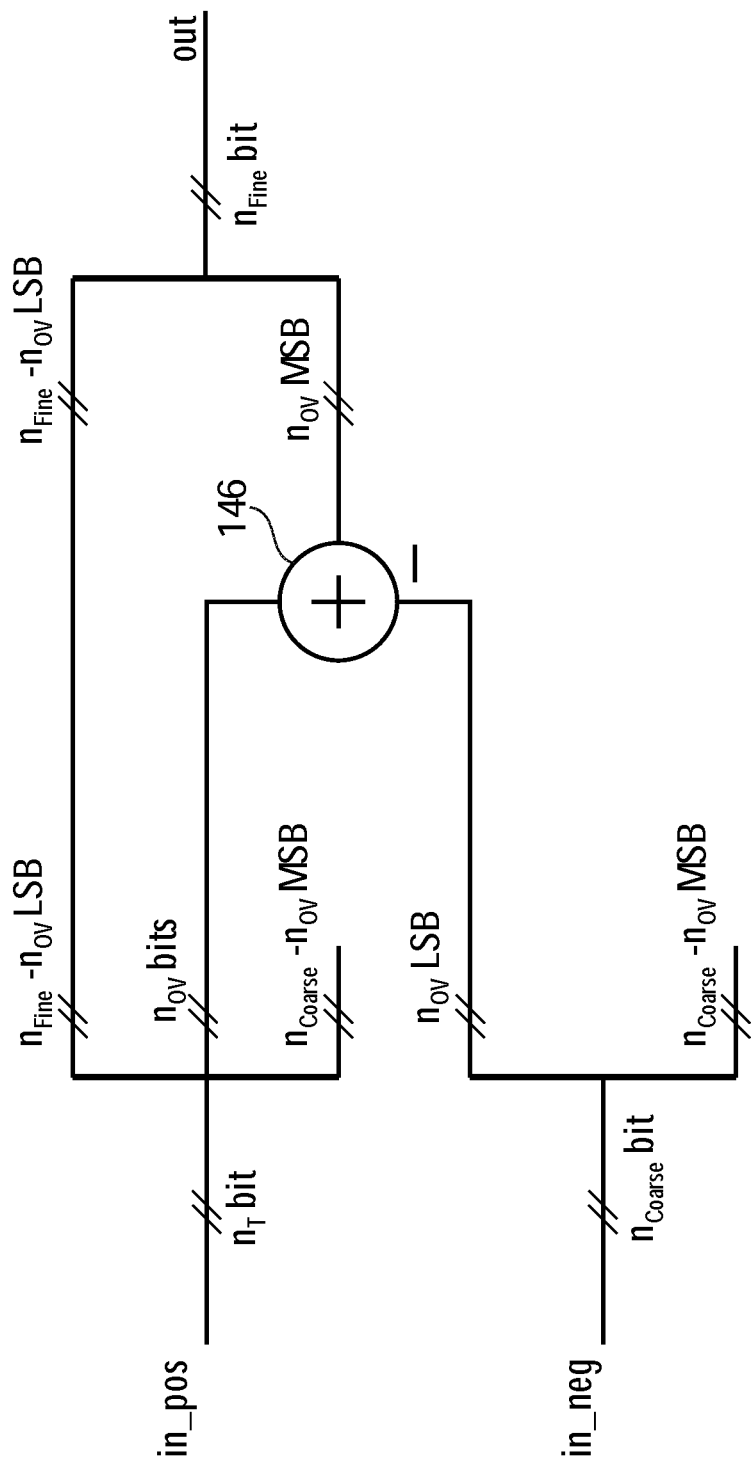
FIG. 15 schematically illustrates the structure of one of the subtractors shown in FIG. 14.

The same applies to the subtractors 146, given in FIG. 15. The DAC has a total bit width of $n_T$ bits. The rate splitter 140 splits this into $n_{coarse}$ bits for the first rate DAC 110 and $n_{Fine}$ bits for the high rate DAC 120. As the fine range DAC 120 has to cover at least one coarse step, $n_{Coarse}+n_{Fine}$ will be at least one bit larger than $n_T$. The overlapping bit range between low and high rate DAC is given by $n_{OV}$. Therefore the number of bits to cover one first rate DAC step is $n_{Fine}-n_{OV}$. As the low rate DAC is quantized to a coarse step, the $n_{Fine}-n_{OV}$ LSB of the coarse quantized minimum value are always 0. Subtracting 0 from the LSBs of the deserialized data stream is equivalent to no operation, i.e. the $n_{Fine}-n_{OV}$ LSB of the subtractor input can be directly wired to the output. Only the difference of the $n_{coarse}$ MSB needs to be calculated. Since this difference is limited and can be represented by $n_{OV}$ bits, the actual subtractor needs to work only on the $n_{OV}$ LSB of the $n_{coarse}$ bits.

Following example helps to understand the relation between the different bit widths:

n=2

Total DAC bit width $n_T$=15 giving a DAC range of 0 to 32767

Low rate coarse DAC resolution $n_{coarse}$=5. Thus one coarse step covers 1024 DAC LSB Maximum difference between two adjacent samples: 3000

Therefore the high rate DAC needs to cover 3000+1024−1=4023 LSB

Round up to next multiple of coarse resolution=4095 LSB

Therefore fine DAC bit width $n_{Fine}$ needs to be 12

There is an overlap of $n_{OV}=n_{Coarse}+n_{Fine}-n_T$=5+12−15=2 bits between low and high rate DAC Therefore the subtractors 146 in the rate splitter circuit need to be only 2 bits wide In other words, each digital value may be represented by a digital word comprising a more significant bit range (or even a most significant bit range) and a less significant bit range (or even a least significant bit range). The coarse converter section is configured to receive and process the more/most significant bit range. The more/most significant bit range is sufficient for representing the temporarily constant coarse portion of the digital value within the current sequence. The fine converter section is configured to receive and process (i.e., in particular to convert to a corresponding analog signal). The less/least significant bit range is sufficient for representing the fine portions of the digital values within the current sequence. The more/most significant bit range and the less/least significant bit range may overlap in an overlapping bit range resulting in both the coarse converter section 110 and the fine converter section 120 being capable of converting bits within the overlapping bit range. The decision as to whether the coarse or the fine converter section should process a particular bit within the overlapping bit range is as follows: The coarse converter section 110 processes the bit in question if the bit is set in a bit representation of the temporarily constant coarse portion which means that the bit is constant during the current coarse conversion period. In the contrary case said bit is processed by the fine converter section 120. The subtracting unit 146 may be configured to process (exclusively) the bits within the overlapping bit range and the subtracting unit 146 may have a bit width that is smaller than a bit width of the digital values.

One further observation is that the sum of the low rate coarse and the high rate fine DAC never needs to exceed the total DAC range. Therefore the coarse DAC just needs to cover the total DAC range minus the high rate fine DAC range. In the example above this would be 32767−4095=28672=281024. Therefore the coarse DAC needs to cover the codes 0 . . . 28 instead of 0 . . . 31.

Therefore the output of the constant portion determiner 144 can be clipped to the maximum required range. Clipping can be implemented after the constant portion determiner 144. When the constant portion determiner 144 is a minimum determiner clipping can also be performed by an additional input to the minimum determiner wired to the range maximum. The digital value splitter or rate splitter 140 may be configured to limit the temporarily constant coarse portion at a limit value (in the above example: $11100_{bin} \times 1024 = 28 \times 1024 = 28672$) that is less than the maximal value which can be represented by the number of bits that are fed to the coarse converter portion (in the above example: $11111_{bin} \times 1024 = 31 \times 1024 = 31744$). The fine converter section 120 may be configured to cover a remaining digital value domain beyond the limit value. For example, as the clipped value is subtracted to obtain the high rate fine samples, the fine DAC will cover the range.

In a typical implementation of a DAC this means, that coarse and fine DAC together contain the same amount of unit cells as a classical architecture. Therefore there is no analog penalty, such as a higher capacitive load at the output node, of this rate split approach.

Figure 16:
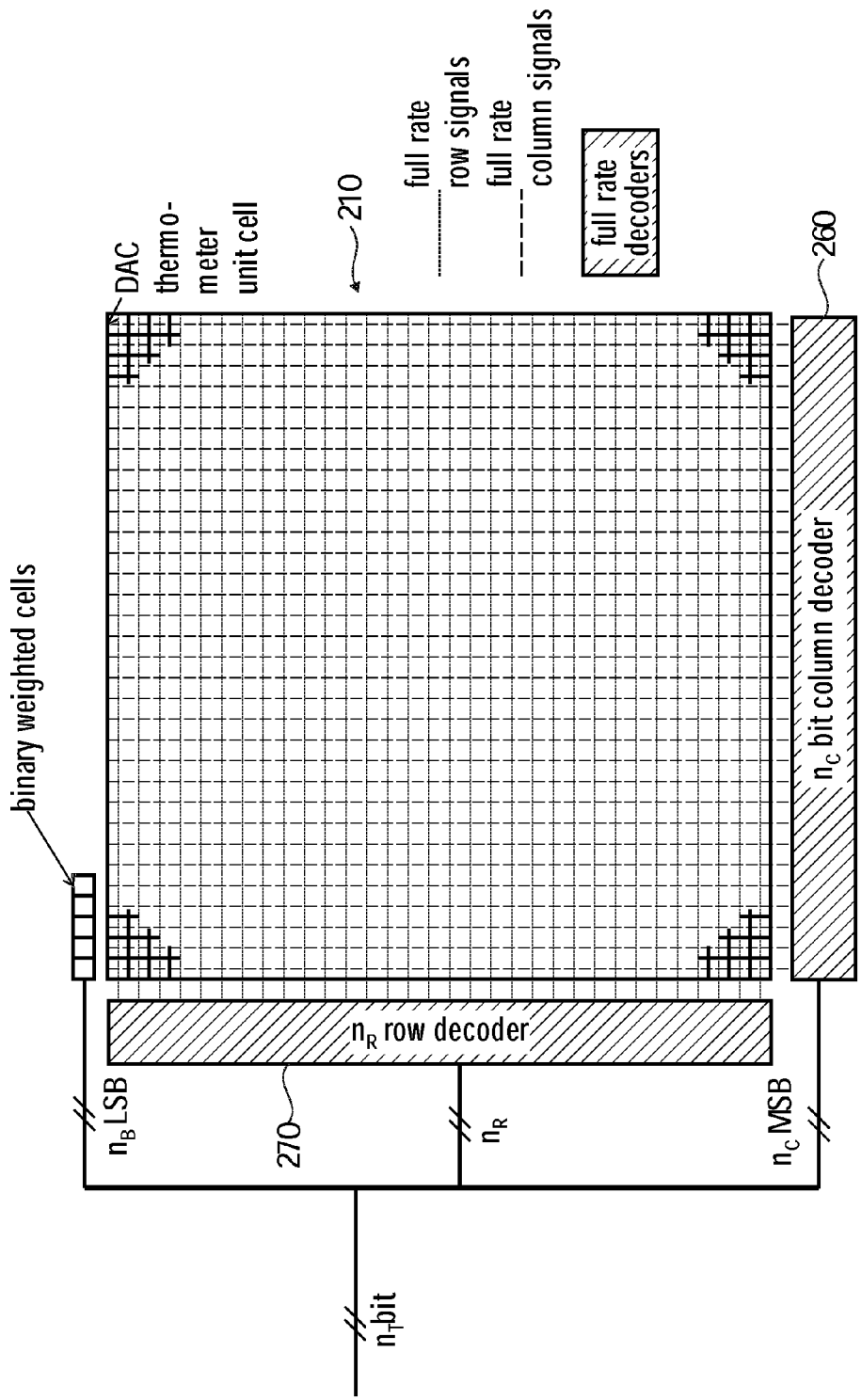
FIG. 16 shows a schematic block diagram of a DAC having a segmented structure with a thermometer encoded DAC and a binary weighted DAC.

A typical DAC may be implemented in a segmented structure. For matching reasons the MSBs of the range are implemented as thermometer DAC and the LSBs are binary weighted cells. In high resolution DACs with a large number of thermometer coded bits, a 2D array structure is used to reduce decoder and wiring complexity, as schematically illustrated in FIG. 16. For clarity reasons, the unit cells of the 2D array structure have been indicated in the corners of the array, only. The two-dimensional array 210 has in the depicted example 32×32=1024 unit cells. The total bitwidth $n_T$ is split into $n_C$ MSB selecting the thermometer column, $n_R$ intermediate bits for selection of the row and $n_B$ LSB driving binary weighted cells. The row decoder 270 and column decoder 260 and the complete row/column signals would run at the maximum rate causing a high power consumption. Following the example from above: $n_T$=15 and $n_C=n_R=n_B$=5. Other values are also possible.

Figure 17:
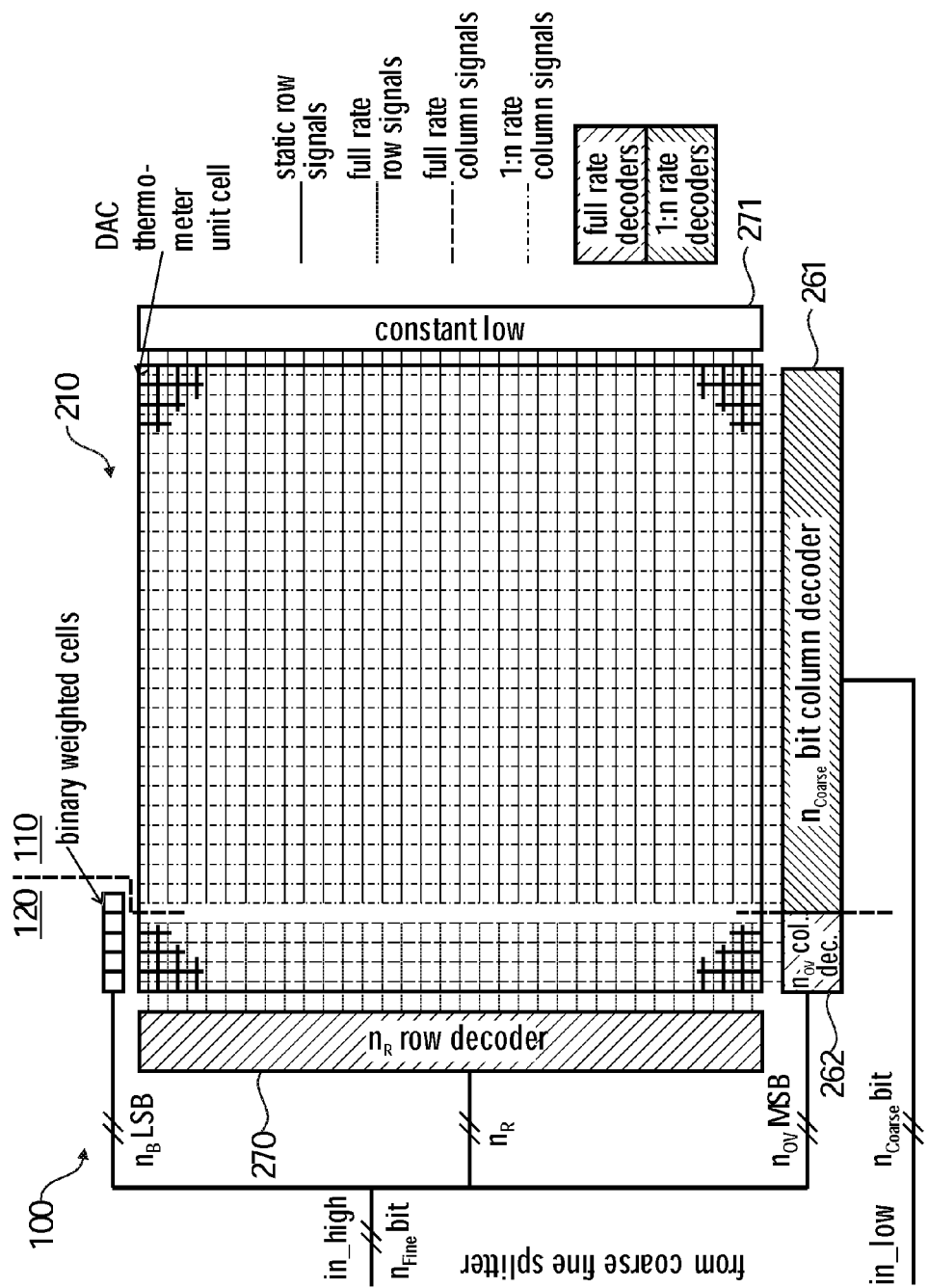
FIG. 17 shows a schematic block diagram of a segmented DAC where the thermometer encoded DAC is split up into a low rate, coarse converter section and a high rate, fine converter section.

Turning now to FIG. 17, in an implementation with rate splitting approach and coarse first rate DAC quantization substantially the same DAC unit cell array 210 as in FIG. 16 could be used. Just the decoders 261, 262, and 270 and row/column wiring would be changed as schematically shown in FIG. 17. The $n_{Fine}$ bit, high rate signal is split into $n_B$ binary weighted LSB, $n_R$ rows and $n_{OV}$ bits for the column decoder. Compared to the typical implementation of FIG. 16, nothing is saved in the row decoder 270 as this runs on full rate. However the column decoder 262 running at high rate is just a 2:4 instead of a 5:32 decoder in the given example. The high rate column decoder 262 is configured to provide the column signals for four columns of the array 210. The column decoder 261 for the remaining columns is a 5:28 decoder. The column decoder 261 may be operated at the first conversion rate, i.e. at a relatively low conversion rate, thus saving power and or current compared to the column decoder 260 in FIG. 16. In a general implementation the high rate column decoder 262 may also have a number of outputs not being a power of 2, i.e. 3 or 5. Both, the high rate column decoder 262 and the low rate column decoder 261 are configured to process the $n_{OV}$ overlap bits. However, the rate splitter 140 determines whether for a given coarse conversion period the overlap bits are to be processed by the high rate column decoder 262 or by the low rate column decoder 261. This assures that the overlap bits are not concurrently processed by the high rate and the low rate column decoders 262, 261.

The first rate input with $n_{coarse}$ bits is connected to a low rate column decoder. This decoder does not decode the full range of possible inputs but the limited clipped range. Due to the coarse quantization, complete columns are switched, i.e. a particular column is either completely active or completely inactive, the row signals for these columns can be static low and can be provided by a constant row signal generator 271.

This saves further current, as these long lines do not need to be driven by dynamic signals. Moreover, the high rate row signals just need to extend over the high rate part of the DAC array, reducing their capacitive load and saving current to drive them. Also the column signal for the left most column of the array 210 may be static, because the unit cells in this leftmost column may be controlled exclusively by the row signals. Accordingly, the high rate column decoder 262 only needs to provide $2^{n_{OV}}-1$ instead of $2^{n_{OV}}$ column signals. As a further option it may also be possible to simplify the cell enabling logic as shown in FIGS. 3 and 4 for the low rate array (row signals do not have to be considered, each cell can be enabled using just the column signal) and for the leftmost column of the high rate array (only the row signals have to be considered). Therefore, the ANDOR gate 50 in FIGS. 3 and 4 may be omitted in these cells.

It can be seen in FIG. 17 that the coarse converter section 110 and the fine converter section 120 share a plurality of activatable cells that are configured to drive a common summing node. In FIG. 17 the boundary between the coarse converter section 110 and the fine converter section 120 is illustrated by a dashed line. In the example of FIG. 17, the binary weighted cells are part of the fine converter section 120. The boundary also separates the first subset and the second subset of cells. The first subset of cells forms at least a part of the coarse converter section 110. The second subset of cells forms at least a portion of the fine converter section 120 (another part of the fine converter section 120 being formed by the five binary weighted cells). In alternative implementation examples, the columns and the rows may be swapped.

Figure 18A:
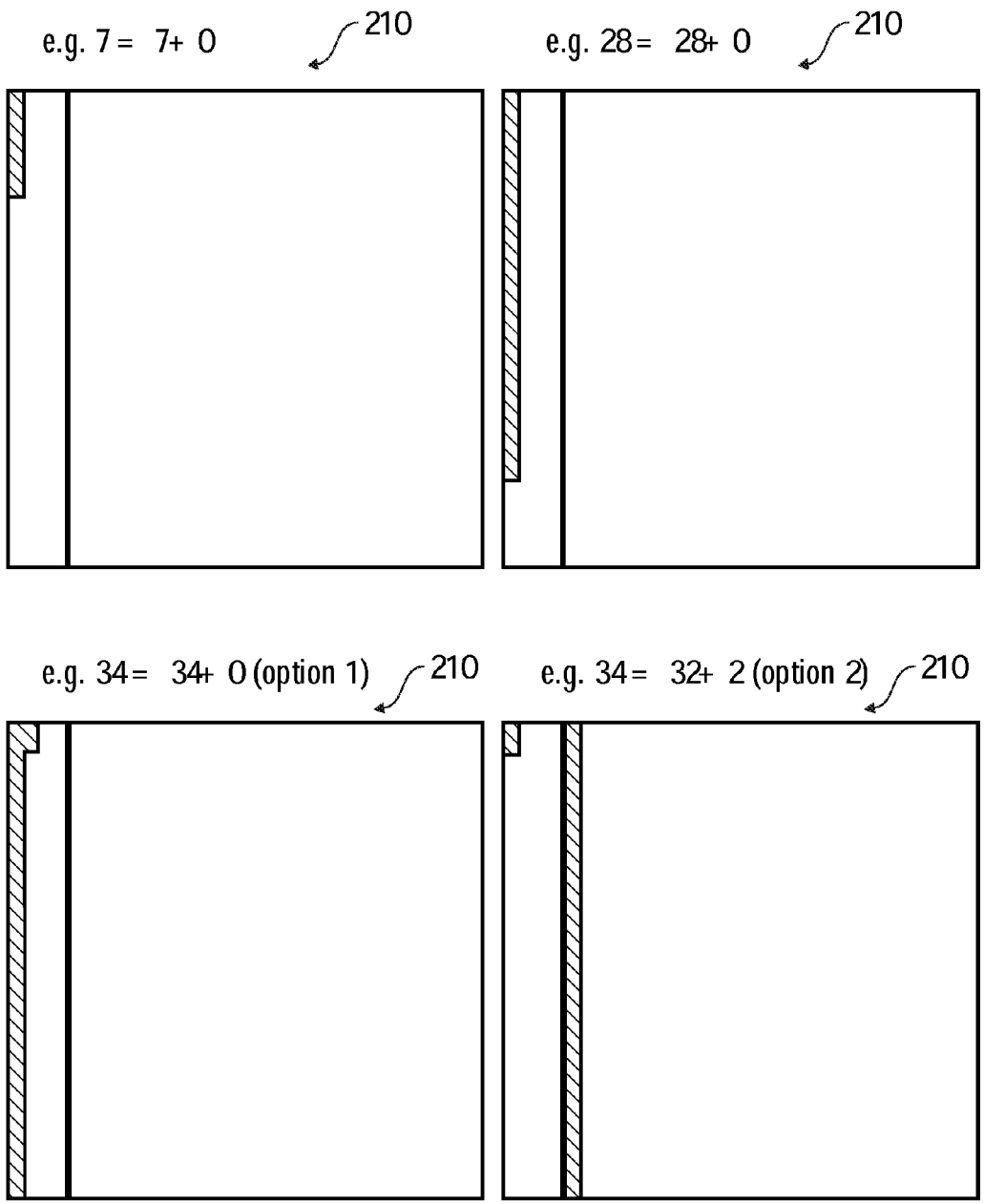
FIGS. 18A and 18B schematically illustrate the two-dimensional array of the thermometer encoded DAC in six different scenarios.
Figure 18B:
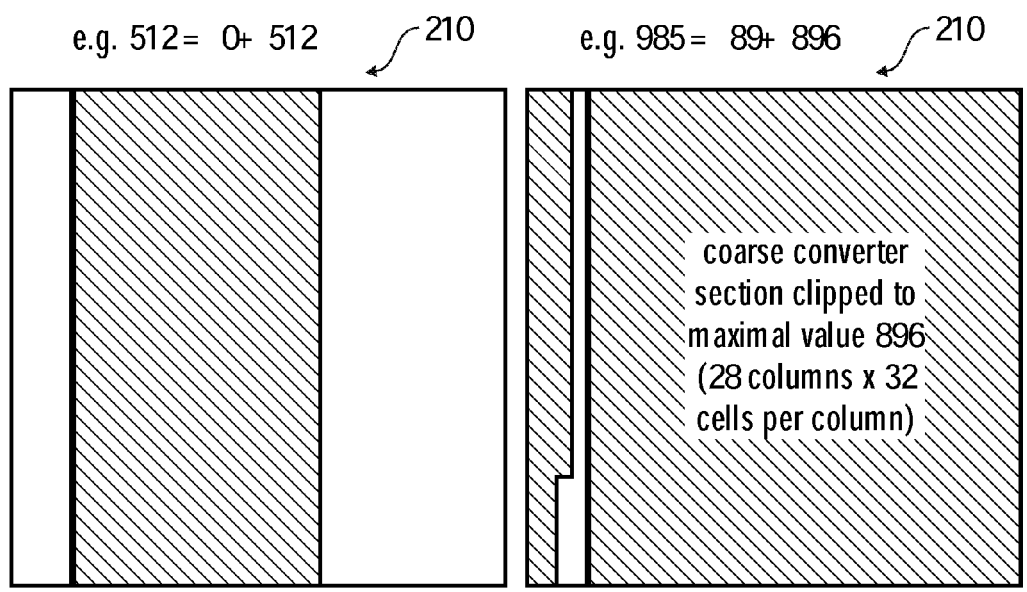

FIGS. 18A and 18B illustrate in a schematic manner how different digital values can be represented by the two-dimensional array 210. For the digital value "7", seven unit cells in the fine second rate array (high rate array) (leftmost column) and zero unit cells in the coarse first rate array (low rate array) are activated. The digital value "28" is converted in a similar manner with 28 cells in the leftmost column of the second rate array being activated.

The digital value "34" can be converted in two different manners, depending on the coarse quantization level that has been determined for the coarse conversion period at hand. According to option 1, only the coarse quantization level is 0 so that exclusively the second rate array contributes to the conversion by activating 34 cells. According to option 2, the coarse quantization level 32 has been selected, for example because none of the digital values in the considered coarse conversion period is smaller than 32. Accordingly, the complete first column of the first rate array is activated, resulting in 32 activated cells. The remaining two cells are contributed by the second rate array.

The digital value "512" corresponds to a coarse quantization level so that it can be represented by activating 16 columns of the first rate array and zero cells of the second rate array. Finally, the digital value "985" can be represented by activating the entire first rate array (or coarse converter section or a part of the coarse converter section), yielding 896 activated unit cells. The remaining 89 activated unit cells are contributed by the second rate array (or fine converter section or a part of the fine converter section).

Figure 19:
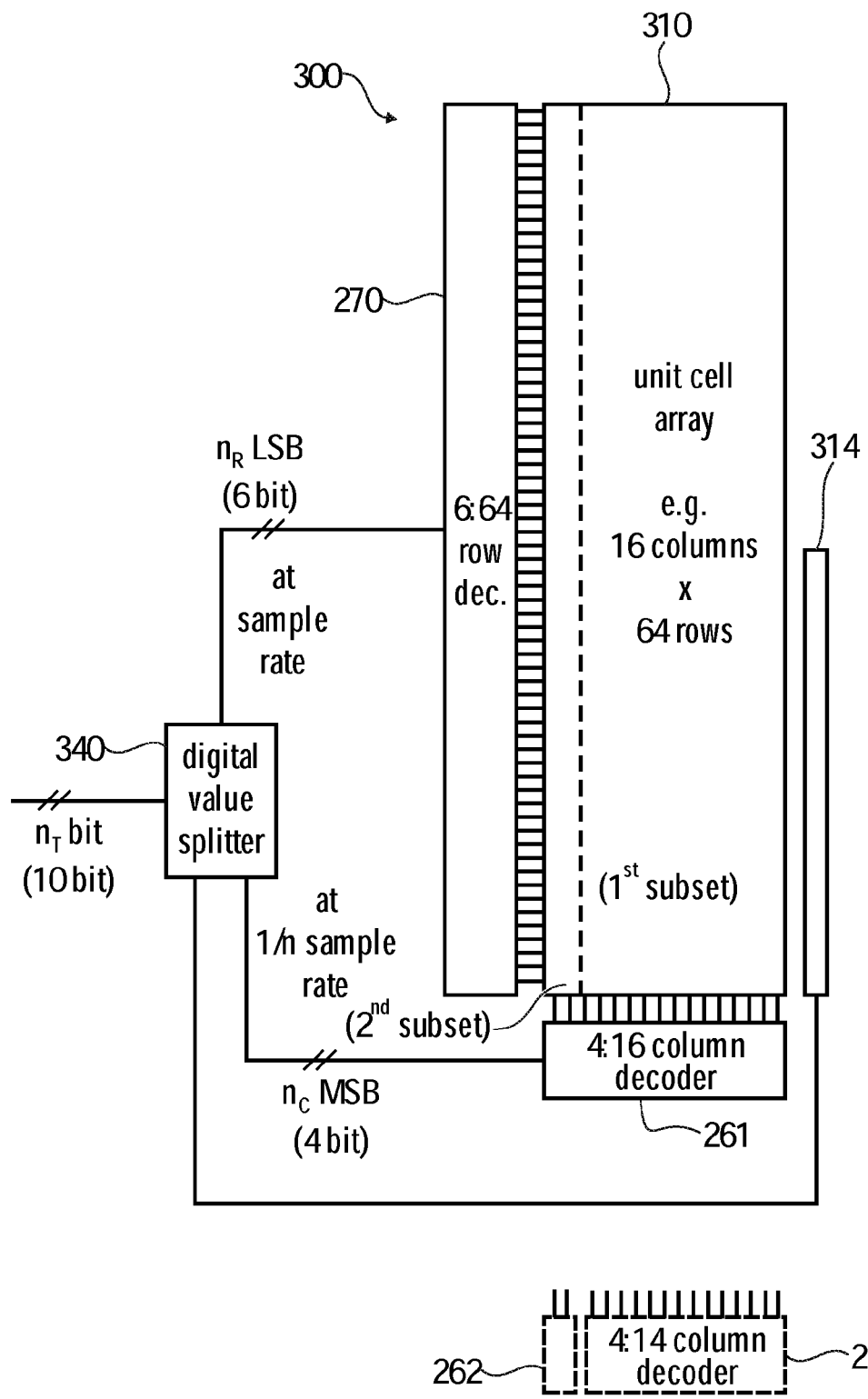
FIG. 19 shows a schematic block diagram of a thermometer encoded DAC comprising a rectangular unit cell array, a row decoder and a column decoder that operates on the basis of a frequency divided clock signal.

FIG. 19 shows a schematic block diagram of a digital-to-analog converter having an alternative structure. The two-dimensional array 310 is here rectangular, e.g. 16 columns by 64 rows (1024, as before). The digital-to-analog converter 300 shown in FIG. 19 comprises the two-dimensional array 310 of (individually) activatable cells configured to drive a common summing node (node shown). The two-dimensional array 310 comprises a plurality of columns and a plurality of rows. A column decoder 261 is configured to decode bits corresponding to a more significant portion of the digital values to a plurality of column control signals for controlling at least a first subset of the plurality of columns. The more significant portion is in the illustrated example represented by the $n_C$ MSBs, where $n_C=4$. In the implementation shown in FIG. 19, the first subset comprises all the 16 columns of the array 310, but in alternative implementations the array 310 may be divided in a high rate portion and a low rate portion, as depicted in and explained in connection with FIG. 17. The DAC 300 further comprises a row decoder 270 configured to decode a less significant portion ($n_R$ LSBs with $n_R=6$ in the depicted example) of the digital values to a plurality of row signals for controlling at least a second subset of the plurality of columns. In one of the examples shown in FIG. 19 the first subset and the second subset of columns are identical because the array 310 is not subdivided in a high rate portion and a low rate portion as in FIG. 17. Such a division of the array 310 in distinct first and second subsets is possible, as illustrated by the second example in FIG. 19, the differences to the first example being drawn in dashed lines. The DAC 300 further comprises a digital value splitter 340 configured to provide the more significant portion to the column decoder 261 at a first rate (e.g., 1/n sample rate) and the less significant portion to the row decoder 270 at an integer multiple of the first rate (e.g., sample rate). The DAC further comprises an additional half-column (partial column) 314 having 32 cells in the illustrated example. The cells of the half-column 314 are substantially identical to the cells of the array 310 and also drive to the common summing node. The half-column 314 may be completely activated or deactivated by a signal issued by the digital value splitter 340. Assume the fine portion has a maximal dynamic range of 32 LSB or less per one conversion period corresponding to the low rate. If the digital value splitter 340 detects that the signal exceeds a coarse quantization level during the current conversion period, the digital value splitter 340 activates the additional half-column 314 for the duration of the currently considered conversion period. Thus, the fine portion can be represented using a single column of the array 310 without a need to switch to another column during the current conversion period of n samples. Hence, the column signals may remain constant during the current conversion period. In this manner, the column decoder 261 may be configured to operate at a lower frequency than the row decoder 270, thus saving power and requiring only relaxed demands on high speed processing capabilities. Furthermore, the relatively long column lines for feeding the 16 different column signals to the activatable cells of the array 310 are driven at the relatively low rate.

According to the second example shown in FIG. 19, a further column decoder 262 (drawn in dashed line FIG. 19) may be provided which is configured to decode at least a least significant bit of the more significant portion of the digital values to at least one further column control signal of the second plurality of columns, here two further column control signals. The column decoder 261 for the remaining 14 columns is also drawn in dashed line beneath the 4-to-16 column decoder 261 drawn in full stroke. A dashed line in the array 310 indicates a boundary between the first subset of columns (columns 3 to 16) and the second subset (columns 1 and 2). A first plurality of row connections may be connected to the activatable cells of the first subset of columns. Likewise, a second plurality of row connections may be connected to the activatable cells of the second subset of columns and to the row decoder 270. The first plurality of row connections is electrically insulated from the second plurality of row connections, i.e. the row connections do not extend across the boundary between the first and second subsets. In FIG. 19, the further column decoder 262 is a 1-to-2 decoder and the decoder 261 is a 4-to-14 decoder.

The digital-to-analog converters 100 or 300 may be mixing DACs configured to mix a digital input signal represented by the digital values with a local oscillator signal for frequency translation. One possible implementation of a mixing DAC is to perform the mixing operation in each unit cell of the array 210, as schematically illustrated in FIG. 4. In case the mixing DAC is a segmented DAC comprising a binary weighted segment, the a suitable mixing operation may be implemented for the binary weighted cells, e.g. modulating a supply current for the binary weighted cells with the local oscillator signal. In particular the fine portion may be provided to the fine converter section 120 at a rate equal to the local oscillator frequency. The temporarily constant portion may be provided to the coarse first converter section 110 at a substantially lower rate (by the factor n).

Figure 20:
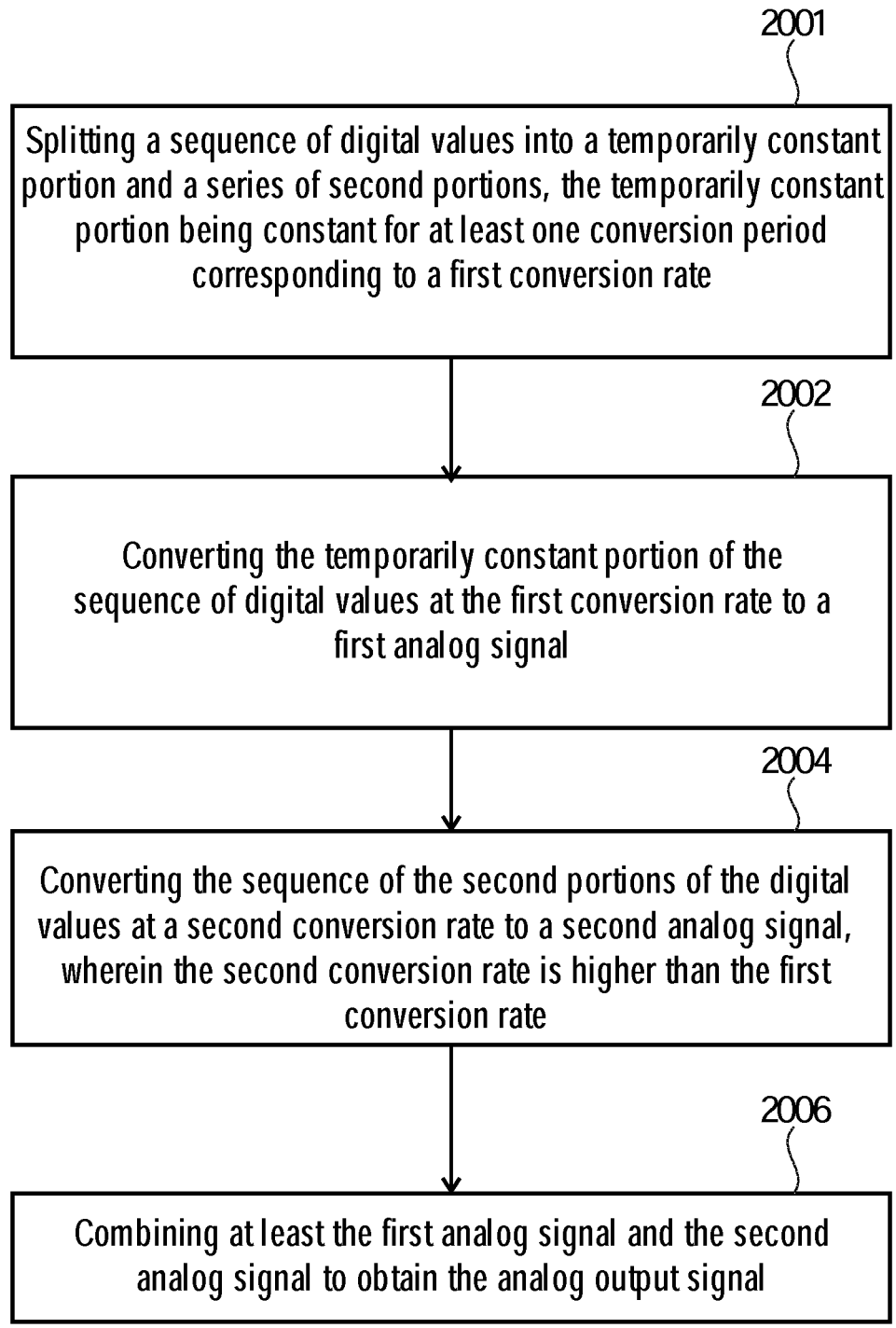
FIG. 20 shows a schematic flow diagram of a method for converting digital values to an analog output signal.

FIG. 20 shows a schematic flow diagram of a method for converting digital values to an analog output signal. The method comprises an act 2001 of splitting a sequence of digital values into a temporarily constant portion and a sequence of second portions. The temporarily constant portion is constant for at least one conversion period corresponding to a first conversion rate. The method further comprises an act 2002 of converting the temporarily constant portion at the first conversion rate to a first analog signal. At 2004 of the method, the sequence of second portions of the digital values is converted, at a second conversion rate, to a second analog signal. The second conversion rate is higher than the first conversion rate. The method also comprises an act 2006 of combining at least the first analog signal and the second analog signal to obtain the analog output signal.

Although some aspects have been described in the context of an apparatus, it is clear that these aspects also represent a description of the corresponding method, where a block or device corresponds to a method act or a feature of a method act. Analogously, aspects described in the context of a method act also represent a description of a corresponding block or item or feature of a corresponding apparatus. Some or all of the method actions may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a punch card, a tape, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

What is claimed is:

1. A digital-to-analog converter for converting digital values to an analog output signal, the digital-to-analog converter comprising:
   a first converter section configured to convert a first, temporarily constant portion of a sequence of the digital values at a first conversion rate to a first analog signal, wherein the temporarily constant portion is constant for at least one conversion period of the first converter section;
   a second converter section configured to convert a second portion of the digital values at a second conversion rate to a second analog signal, wherein the second conversion rate is higher than the first conversion rate; and
   a signal combiner configured to combine at least the first analog signal and the second analog signal to obtain the analog output signal.

2. The digital-to-analog converter according to claim 1, wherein the first converter section is configured to cover a first range of values and the second converter section is configured to cover a second range of values that is smaller than the first range of values.

3. The digital-to-analog converter according to claim 1, further comprising a digital value splitter configured to split a sequence of the digital values to be converted during a conversion period of the first converter section into the temporarily constant portion and a sequence of second portions.

4. The digital-to-analog converter according to claim 3, wherein the digital value splitter comprises:
   a digital value storage configured to store the sequence of digital values to be converted during the conversion period of the first converter section;
   a constant portion determiner configured to determine the temporarily constant portion as a function of the digital values stored in the digital value storage; and
   a subtracting unit configured to subtract the temporarily constant portion from the digital values stored in the digital value storage to obtain the sequence of second portions.

5. The digital-to-analog converter according to claim 4, wherein the constant portion determiner has a bit width smaller than a bit width of the digital values and is configured to determine the constant value based on a most significant portion of the digital values.

6. The digital-to-analog converter according to claim 4, wherein the constant portion determiner is a minimum determiner.

7. The digital-to-analog converter according to claim 4, wherein the subtracting unit comprises a plurality of subtractors, wherein each subtractor is configured to subtract the constant value from a corresponding digital value stored in the digital value storage to provide a corresponding second portion of the sequence of second portions.

8. The digital-to-analog converter according to claim 4,
   wherein each digital value is represented by a digital word comprising a most significant bit range and a least significant bit range, wherein the first converter section is a coarse converter section configured to receive and process the most significant bit range sufficient for representing the first, temporarily constant portion, and wherein the second converter section is a fine converter section configured to receive and process the least significant bit range sufficient for representing the second portion of the digital values;

wherein the most significant bit range and the least significant bit range overlap in an overlapping bit range resulting in both the coarse converter section and the fine converter section being capable of converting bits within the overlapping bit range, wherein a bit in the overlapping bit range is processed by the coarse converter section if the bit is set in a bit representation of the temporarily constant portion and else processed by the fine converter section;

wherein the subtracting unit is configured to process the bits within the overlapping bit range and has a bit width smaller than a bit width of the digital values.

9. The digital-to-analog converter according to claim 3, wherein the digital value splitter is configured to limit the first, temporarily constant portion at a limit value that is less than a maximal value representable by a number of bits that are fed to the first converter section, wherein the second converter section is configured to cover a remaining digital value domain beyond the limit value.

10. The digital-to-analog converter according to claim 1, wherein each digital value is represented by a digital word comprising a most significant bit range and a least significant bit range, wherein the first converter section is a coarse converter section configured to receive and process the most significant bit range sufficient for representing the temporarily constant portion, and wherein the second converter section is a fine converter section configured to receive and process the least significant bit range sufficient for representing the second portion of the digital values, wherein the least significant bit range comprises fewer bits than a number of bits of the digital word.

11. The digital-to-analog converter according to claim 10, wherein the most significant bit range and the least significant bit range overlap in an overlapping bit range resulting in both the first converter section and the second converter section being capable of converting bits within the overlapping bit range, wherein a bit in the overlapping bit range is processed by the first converter section if the bit is set in a bit representation of the temporarily constant portion and else processed by the second converter section.

12. The digital-to-analog converter according to claim 1, wherein the first converter section and the second converter section share a plurality of activatable cells configured to drive a common summing node, the first subset of the activatable cells forming at least a part of the first converter section and a second subset of the activatable cells forming at least a part of the second converter section.

13. The digital-to-analog converter according to claim 12, wherein the plurality of activatable cells are arranged as a two-dimensional array and wherein the digital-to-analog converter further comprises
a column decoder configured to operate at the first conversion rate and decode bits corresponding to the temporarily constant portion to a plurality of column control signals for controlling columns forming the first subset of the activatable cells; and
a row decoder configured to operate at the second conversion rate and decode bits corresponding the second portion to a plurality of row control signals for controlling the second subset of the activatable cells.

14. The digital-to-analog converter according to claim 13, further comprising a further column decoder configured to operate at the second conversion rate and decode at least one further bit corresponding to the second portion to at least one further column signal for controlling, together with the row decoder, the second subset of the activatable cells.

15. The digital-to-analog converter according to claim 13, wherein row signals for the first subset of activatable cells are set to a constant value.

16. The digital-to-analog converter according to claim 12, wherein the plurality of activatable cells are arranged as a two-dimensional array and wherein the digital-to-analog converter further comprises:
a row decoder configured to operate at the first conversion rate and decode bits corresponding to the temporarily constant portion to a plurality of row control signals for controlling rows forming the first subset of the activatable cells; and
a column decoder configured to operate at the second conversion rate and decode bits corresponding the second portion to a plurality of column control signals for controlling the second subset of the activatable cells.

17. The digital-to-analog converter according to claim 16, further comprising a further row decoder configured to operate at the second conversion rate and decode at least one further bit corresponding to the second portion to at least one further row signal for controlling, together with the column decoder, the second subset of the activatable cells.

18. The digital-to-analog converter according to claim 16, wherein column signals for the first subset of activatable cells are set to a constant value.

19. The digital-to-analog converter according to claim 1, wherein the digital-to-analog converter is a mixing digital-to-analog converter configured to mix a digital input signal represented by the digital values with a local oscillator signal for frequency translation.

20. The digital-to-analog converter according to claim 19, further comprising a frequency divider configured to frequency divide the local oscillator signal, wherein the second conversion rate is a local oscillator frequency or a fraction of the local oscillator frequency, and the first conversion rate is a fraction of the second conversion rate.

21. A digital-to-analog converter for converting digital values to an analog output signal, the digital-to-analog converter comprising:
a two-dimensional array of activatable cells configured to drive a common summing node, the two-dimensional array comprising a plurality of columns and a plurality of rows;
a column decoder configured to decode bits corresponding to a more significant portion of the digital values to a plurality of column control signals for controlling at least a first subset of the plurality of columns;
a row decoder configured to decode a less significant portion of the digital values to a plurality of row signals for controlling at least a second subset of the plurality of columns; and
a digital value splitter configured to provide the more significant portion to the column decoder at a first rate and the less significant portion to the row decoder at an integer multiple of the first rate.

22. The digital-to-analog converter according to claim 21, further comprising:
a further column decoder configured to decode at least a least significant bit of the more significant portion of the digital values to at least one further column control signal of the second plurality of columns;
a first plurality of row connections connected to the activatable cells of the first subset of columns; and
a second plurality of row connections connected to the activatable cells of the second subset of columns to the row decoder, wherein the first plurality of row connections is electrically insulated from the second plurality of row connections.

23. A digital-to-analog converter for converting digital values to an analog output signal, the digital-to-analog converter comprising:
a means for converting a first, temporarily constant portion of a sequence of the digital values at a first conversion rate to a first analog signal, wherein the temporarily constant portion is constant for at least one conversion period of the means for converting the temporarily constant portion;
a means for converting a second portion of the digital values at a second conversion rate to a second analog signal, wherein the second conversion rate is higher than the first conversion rate; and
a signal combiner configured to combine at least the first analog signal and the second analog signal to obtain the analog output signal.

24. A mobile communications device comprising a digital-to-analog converter configured to convert digital values to an analog output signal for transmission via an antenna of the mobile communications device, the digital-to-analog converter comprising:
a first converter section configured to convert a first, temporarily constant portion of a sequence of the digital values at a first conversion rate to a first analog signal, wherein the temporarily constant portion is constant for at least one conversion period of the first converter section;
a second converter section configured to convert a second portion of the digital values at a second conversion rate to a second analog signal, wherein the second conversion rate is higher than the first conversion rate; and
a signal combiner configured to combine at least the first analog signal and the second analog signal to obtain the analog output signal.

25. A method for converting digital values to an analog output signal, the method comprising:
converting a first, temporarily constant portion of a sequence of the digital values at a first conversion rate to a first analog signal, wherein the temporarily constant portion is constant for at least one conversion period corresponding to the first conversion rate;
converting a second portion of the digital values at a second conversion rate to a second analog signal, wherein the second conversion rate is higher than the first conversion rate; and
combining at least the first analog signal and the second analog signal to obtain the analog output signal.

26. The method according to claim 25, further comprising:
splitting the sequence of digital values to be converted during a conversion period corresponding to the first conversion rate into the first, temporarily constant portion and a sequence of second portions.

27. The method according to claim 26, wherein splitting the sequence of digital values comprises:
storing the sequence of digital values to be converted during the conversion period corresponding to the first conversion rate;
determining the first, temporarily constant portion as a function of the stored digital values;
subtracting the temporarily constant portion from the stored digital values to obtain the sequence of second portions.

28. The method according to claim 27, wherein determining the first, temporarily constant portion is performed using fewer bits than a bit width of the digital values and on the basis of a most significant portion of the digital values.

29. The method according to claim 25,
wherein each digital value is represented by a digital word comprising a most significant bit range sufficient for representing the temporarily constant portion and a least significant bit range sufficient for representing the second portion of the digital values,
wherein the most significant bit range and the least significant bit range overlap in an overlapping bit range, and
wherein a bit in the overlapping bit range is processed in the action of converting the temporarily constant portion if the bit is set in a bit representation of the temporarily constant portion and else processed in the action of converting the second portion.

30. The method according to claim 25, further comprising:
decoding, at the first conversion rate, bits corresponding to the first, temporarily constant portion to a plurality of column control signals for controlling columns forming a first subset of a two-dimensional array of activatable cells; and
decoding, at the second conversion rate, bits corresponding to the second portion to a plurality of row control signals for controlling a second subset of the two-dimensional array of activatable cells;
wherein the activatable cells are configured to drive a common summing node.

31. The method according to claim 30, further comprising:
decoding, at the second conversion rate, at least one further bit corresponding to the second portion to at least one further column signal for controlling, together with the plurality of row control signals, the second subset of the activatable cells.

32. The method according to claim 25, further comprising:
applying a local oscillator signal when converting the first, temporarily constant portion and when converting the second portions for frequency translation.

33. The method according to claim 32, further comprising:
frequency dividing the local oscillator signal to obtain a frequency divided local oscillator signal, wherein the local oscillator signal corresponds to the second conversion rate and the frequency divided local oscillator signal corresponds to the first conversion rate.

34. A method for converting digital values to an analog output signal, the method comprising:
splitting a sequence of digital values into a more significant portion and a less significant portion;
converting, at a low rate, the more significant portion to a first analog signal,
wherein converting the more significant portion comprises generating, based on the more significant portion, a plurality of column control signals for controlling at least a first subset of a plurality of columns of a two-dimensional array of activatable cells configured to drive a common summing node;
converting, at a high rate, the less significant portion to a second analog signal,
wherein converting the less significant portion comprises generating, based on the less significant portion, a plurality of row control signals for controlling at least a second subset of the plurality of columns; and
combining at least the first analog signal and the second analog signal to obtain the analog output signal.

35. The method according to claim 34, wherein converting the less significant portion further comprises decoding at least one bit of the less significant portion to at least one further column signal for controlling, together with the plurality of row control signals, the second subset of the activatable cells.

\* \* \* \* \*